United States Patent [19]

Schulz

[11] 4,155,004
[45] * May 15, 1979

[54] PHOTOELECTRIC TRANSDUCING UNIT AND SYSTEM FOR DETECTING THE SHARPNESS OF THE IMAGE OF OBJECT BY MEANS OF THE UNIT -AND- A FOCUSING ARRANGEMENT

[75] Inventor: Hansrichard Schulz, Villingen-Schwenningen, Fed. Rep. of Germany

[73] Assignee: Canon Kabushiki Kaisha, Tokyo, Japan

[*] Notice: The portion of the term of this patent subsequent to Apr. 19, 1994, has been disclaimed.

[21] Appl. No.: 833,990

[22] Filed: Sep. 16, 1977

Related U.S. Application Data

[63] Continuation of Ser. No. 808,320, Jun. 20, 1977, which is a continuation of Ser. No. 723,968, Sep. 16, 1976, abandoned, which is a continuation of Ser. No. 633,099, Nov. 19, 1975, Pat. No. 4,049,960, which is a continuation of Ser. No. 463,690, Apr. 24, 1974, abandoned, and a continuation of Ser. No. 748,192, Dec. 7, 1976, abandoned, which is a continuation of Ser. No. 545,473, Jan. 30, 1975, Pat. No. 4,019,049.

[30] Foreign Application Priority Data

Feb. 8, 1974 [DE] Fed. Rep. of Germany ....... 2406044
Feb. 14, 1974 [DE] Fed. Rep. of Germany ....... 2407105
Feb. 18, 1974 [DE] Fed. Rep. of Germany ....... 2407639

[51] Int. Cl.$^2$ .............................................. G01J 1/20
[52] U.S. Cl. ................................... 250/201; 250/204; 250/211 R; 354/25

[58] Field of Search .......... 250/201, 204, 209, 211 R, 250/211 J, 578; 354/25, 31, 162, 163, 195; 356/4, 5

[56] References Cited

U.S. PATENT DOCUMENTS

| 3,838,275 | 9/1975 | Stauffer | 250/204 |
|---|---|---|---|
| 3,857,031 | 12/1974 | Sinclair et al. | 250/201 |
| 3,885,151 | 5/1975 | Tokushima | 250/211 R |
| 4,019,049 | 4/1977 | Schulz | 250/201 |
| 4,049,960 | 9/1977 | Schulz | 250/209 |

*Primary Examiner*—David C. Nelms
*Attorney, Agent, or Firm*—Toren, McGeady and Stanger

[57] ABSTRACT

In the arrangement disclosed, a photoconductive cell has electrical characteristics which depend upon its optical exposure. An optical system focuses an image upon the cell. An electrical system utilizes the output of the cell on the basis of the light upon the cell. The cell includes a multiplicity of photoconductive portions forming at least one row transverse to the direction of image intensity changes so that different portion sense different intensities. The electrical means are connected to a plurality of the portions. The portions may be formed into an elongated integral strip whose direction changes and whose edges are insulated from each other. Alternately the portions may be connected electrically to form a continuous electrical strip. The strip may have a spiral shape. In one embodiment the portions are connected together to form an AND or OR gate. Two identical cells may straddle a desired image plane and be subject to the same image. Suitable means respond to the differences between the cells to drive a motor which adjusts an image-forming objective.

73 Claims, 49 Drawing Figures

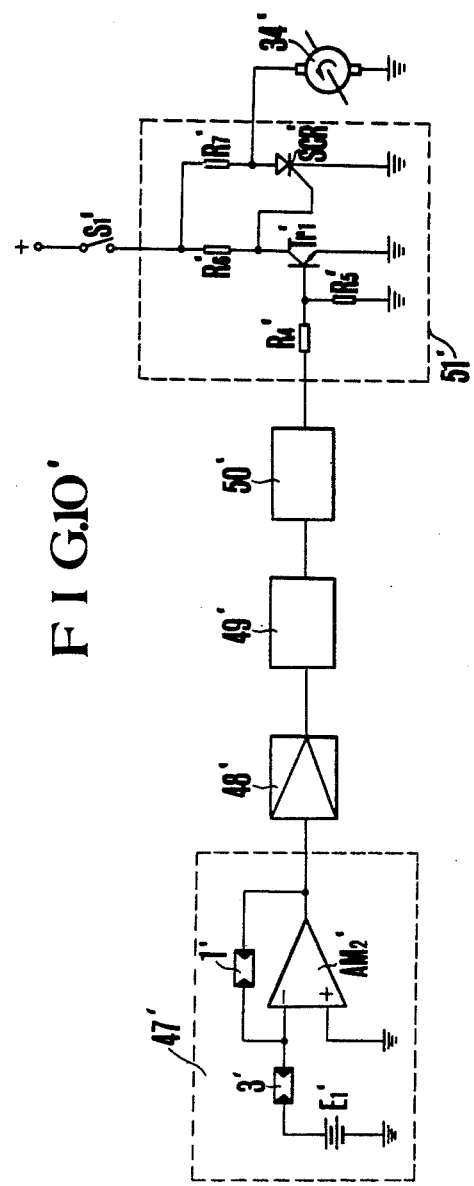
F I G. 10'

PHOTOELECTRIC TRANSDUCING UNIT AND SYSTEM FOR DETECTING THE SHARPNESS OF THE IMAGE OF OBJECT BY MEANS OF THE UNIT -AND- A FOCUSING ARRANGEMENT

This is a continuation of application Ser. No. 808,320, filed June 20, 1977, which in turn is a continuation of application Ser. No. 723,968 filed Sept. 16, 1976 now abandoned, which in turn is a continuation application of Ser. No. 633,099 filed Nov. 19, 1975 now U.S. Pat. No. 4,049,960, which in turn is a continuation of application Ser. No. 463,690 filed Apr. 24, 1974 now abandoned. This is also a continuation of application Ser. No. 748,192 filed Dec. 7, 1976 now abandoned which in turn is a continuation of application Ser. No. 545,473 filed Jan. 30, 1975 now U.S. Pat. No. 4,019,049.

BACKGROUND OF THE INVENTION

The invention relates to an arrangement for automatic range finding, particularly for sharply focusing a motor-driven objective lens.

The present invention also relates to a photoelectric transducing unit and a system for detecting the sharpness of the image of object by means of the unit, more particularly to the disposition of a photoelectric transducer in the photoelectric transducing unit consisting of at least two photoelectric transducers whoes output characteristics are different from each other and whoes photosensitive layers preferably exist in the same image forming plane as well as to a system for detecting the sharpness of the image of object by means of the photoelectric transducing unit, especially to a system adequate for the focus detection and/or the automatic focus adjustment in the optical instrument presenting an image forming optics.

Modern cameras furnish automatic exposure measurement devices and facilities for setting the diaphragm and/or the exposure time. However, no camera on the market successfully furnishes sharp automatic focusing.

Automatic range finding methods are known, but implementing them is so costly that they are completely unsuitable for cameras. One known automatic objective focusing method involves determining the range by means of radar or optical goniometry and setting the objective to the determined range by a motor. Apart from the fact that the costs of the equipment are rather high, automatic and continuous check of the definition achieved is generally not possible.

This last mentioned drawback is avoided in a recently developed special optical system. Here the signal controlling the motor drive is generated by means of a photocell which receives light deflected by a mirror from the optical path of the objective. In this arrangement an annular reflecting mirror deflects the marginal rays of a special objective onto an axially oscillating photocell. During the oscillation of the cell through the range of maximum image sharpness, the voltage generated by the photocell in dependence on the light density passes through a flat maximum. To obtain automatic readjustment of the definition the position of the maximum is used by a phase detector which receives a reference signal in the form of the a-c voltage required for the mechanical oscillating drive.

But this method can only be used with an objective where the front and rear elements are arranged sufficiently far from each other to provide room between them for the above mentioned annular reflecting mirror. The latter only deflects marginal rays with extremely low depth of focus, to the photocell. In the photocell, these low depth of focus marginal rays cause a light density which traverses a flat maximum in dependence on the image sharpness, hence with the photocell moving in the direction of the rays.

The mechanism for generating the oscillating movement of the photocell is costly and susceptible to trouble and makes the use of complicated phase detectors etc., an absolute necessity. However, this solution is not applicable to usually existing objectives where close front and rear elements constitute parts of an assembled objective.

In the conventional disposition of the two photoelectric transducers reacting to the contrast of the image formed by an image forming optics it is requested that a semipermeable light beam splitter should be disposed in the optical path between the objective lens and the photoconductive layers of the photoelectric transducers in such a manner that the light beam coming through the objective lens and reflected by means of the light beam splitter should reach the first photoelectric transducers while the light beam coming through the objective lens and passing through the light beam splitter should reach the second photoelectric transducer. Hereby the photosensitive layers of the both photoelectric transducers are generally disposed in the image planes of the two images formed by the light beams projected by means of the objective lens and splitted by means of the light beam splitter.

For this kind of disposition such disposition has already been known that the one photoelectric transducer is composed of for example, photosensitive layer zones connected in series (series type photoelectric transducer) while the other photoelectric transducer is composed of for example, photosensitive layer zones connected in parallel (parallel type photoelectric transducer). In this kind of disposition, by connecting these photoelectric transducers in for example, a proper bridge circuit it is possible to obtain a signal which assumes a limit value when the contrast of the fine parts of an image is maximum, namely the image planes correspond with the photosensitive layers of the photoelectrical transducers.

However, this kind of disposition is not only expensive but also needs a comparatively large space as well as a fine careful adjustment. In view of the fact that two sets of a pair of this kind of photoelectric transducers are needed in order to automatically adjust the focussing of an objective lens not presenting a movable part together with the direction of the objective lens, the disposition of at least three semipermeable light beam splitters presenting four photoelectric transducers to be adjusted very carefully becomes remarkably complicated.

The space hereby needed would be large in size out of discussion as compared with the ordinary size of the camera of today.

In case a pair of this kind of the photoelectric transducers presenting a semipermeable light beam splitter is adopted for the automatic focus adjustment of the image forming optics, the mechanical vibration becomes necessary for the photoelectrical transducers or the auxiliary reflecting body or the prism disposed in the optical path of the optics with the result that in this case also the problem about the necessary space and the adjustment takes place.

On the other hand when a passive automatic focus adjustment equipment or a focus detecting equipment for an optical instrument such as camera by making use of such photoelectric transducers as mentioned above it is requested that the equipment should operate with sureness over a wide range of the brightness covering several ten times. What is at first to be solved basically is the problem as to how to stabilize the initial value of the measured value disturbed by the variation of the offset voltage of the amplifier for amplifying the signals to be measured or the noise output due to the constructional difference of the photoelectric transducers themselves.

Namely, the signal voltage generated by the photoelectric transducers reacting to the contrast of the image is necessarily small as the level of the intensity to be measured (due to the non-linear effect) especially in case the contrast of the image is low, a comparatively high amplification becomes necessary. However, a desirable effect of such a high amplification as mentioned above can be expected much of only when a signal with sufficiently high S/N ratio (ratio of signal to noise) is put in the amplifier, namely the above mentioned noise voltage is sufficiently small (at least -20db) as compared with the signal voltage to be measured which is thought the effective signal, so that the above mentioned problem as to how to stabilize the initial value of the intensity to be measured should be solved basically.

An object of this invention is to avoid these shortcomings.

Still another object is to improve automatic focusing systems.

Another object of the present invention is to provide an arrangement for automatic focus detection where commerical objectives can be used and which can be realized with a minimum of circuit and material expenditure.

SUMMARY OF THE INVENTION

According to a feature of the invention a mirror deflects part of the light from the optical path of a motor driven objective onto a photocell which generates a signal controlling the objective motor drive in dependence on the contrast of an image produced on its surface. According to another feature, the photoconductive cell includes elementary or incremental regions connected in series and arranged in the form of one or several rows. These extend, at a great number of points over the entire row width, perpendicular to the light-dark transistions of the image structure.

The photoconductive cell according to the invention is characterized by a resistance maximum when the definition of the image produced on its surface is optimum. This effect is due to the fact that a maximum contrast appears with optimum image sharpness, that is the dark image areas are darkest and the light image areas are lightest, while the dark contrast is lower when the image is blurred. As is shown mathematically in the description of the figures, the total resistance of the series-connected elementary or incremental regions of the photoconductive cell increases with increasing contrast. Thus a signal controlling the sharp focusing of the objective can be derived from the variation of the resistance.

According to another feature of the invention, to derive a control signal by means of such a photoconductive cell from any image structure, the series connected or incremental regions of the photoconductive cell are distributed in the form of one or several rows over the image area in such a way that all possible directional angles of the light-dark transitions are uniformly determined.

According to still another feature of the invention, the rows of the photoconductive cell are distributed in any desired, possibly varying, orientation over the image plane and connected in series. The ends of the series-connected rows outside the image area are connected with light-insensitive lead wires. Preferably the wires are provided with a light-independent shunt, for example, of silver.

According to another feature of the invention, the connections are provided outside the image region.

According to another feature of the invention the photoconductive cell rows are arranged bifilarly.

According to another feature of the invention the rows are arranged in the form of polygonal-, particularly rectangular, circular etc. spirals.

According to another feature of the invention the rows are distributed in sinusoidal, meander, sawtooth, star, or similar form over the image area.

With these arrangements the maximum total resistance of the series-connected cell rows is always achieved with maximum image sharpness, regardless of the direction of the image structures.

According to another feature of the invention, a control circuit controls the objective motor drive. Here two identical photoconductive cells according to the invention are used. These photoconductive cells are mounted in two different image planes, each at a different distance from the objective, so that when the objective is set for sharp focusing, the two photocells are in front of and behind the plane of optimum image sharpness. Preferably they are offset from the optimum plane by the same distance. The difference in output between the cells is measured and used to control the objective drive motor.

According to another feature of the invention, the two photoconductive cells are connected in series between a voltage source to form a voltage divider whose divider center is coupled through an amplifier circuit with a high input resistance to the control circuit of the driving motor. The use of an amplifier circuit with a high input resistance avoids an undesired load on the high-ohmic photoconductive cells whose resistance value is of the order of megohms. For this reason a field effect transistor, preferably wired as a source follower, is arranged in the input circuit.

According to another feature of the invention, the control circuit of the drive motor, preferably a d-c motor, is set to cause itself and the objective to assume its rest position only when both photoconductive cells of the voltage divider have the same resistance value. This occurs when the images produced on the surface of the photoconductive cells, which are arranged the same distance in front of and behind the plane of optimum image sharpness, are equally blurred. The objective is adjusted so that the image produced under these conditions, for example, on the emulsion or in the viewing plane, has maximum image sharpness.

The use of the photoconductive cells according to the invention in a divider circuit has the great advantage that the potential of the divider point, with uniformly illuminated photoconductive cells, remains substantially independent of the intensity of illumination over several decimal powers of the illumination.

According to another feature of the invention, a double push-pull driver stage composed of complementary transistors serves as a control circuit behind the input loop of the amplifier circuit. It controls a double push-pull output stage, likewise composed of complementary power transistors and forming a bridge in whose diagonal the drive motor is connected. In this circuit arrangement, only one pair of the diagonally opposed complementary transistors is conductive. This then turns on one of the complementary transistors of the respective diagonal in the cascaded double push-pull circuit of the power transistors.

This circuit has the advantage that the full battery voltage less the collector-emitter voltage of the respective open power transistors, which is of the order of 0.3 V, is available for driving the motor in both rotational directions.

Thus reliable motor-driven sharp focusing is possible with optimum torque and efficiency, even with low battery voltages such as 3 volts.

According to another feature of the invention, where two identical photoconductor cells form a voltage divider, the same amount of light is fed to both photoconductive cells, and the photoconductive cells are arranged staggered relative to the direction of the beam.

According to another feature of the invention, this is achieved by a beam splitter arranged in the optical path of the objective and the photoconductive cells are arranged in varying distances from the beam splitter.

According to another feature of the invention a beam splitting prism with a square cross section serves as a beam splitter. The photoconductive cells are provided on the faces arranged in the optical path, and a distance plate of optically transmissive material is arranged between one photoconductive cell and a prism face. This distance plate extends the light path to one of the two photoconductive cells relative to the other. In the state of equilibrium, the plane of optimum image sharpness extends a distance of half the thickness of the distance plate in front of one photoconductive cell and the same distance behind the light-sensitive coat of the other photoconductive cell.

If the two cells are not symmetrically excited, that is, if a sharper image is produced on one photoconductive cell than on the other, and the plane of optimum image sharpness of one photoconductive cell is closer to the light-sensitive coat of one cell and farther away from that of the other cell, then the adjusted image distance is too small, that is, the object is farther away from the camera than indicated by the instantaneous range setting of the camera objective.

With the exception of a residual error, the automatic sharp focusing according to the invention causes the motor to move the range setting of the objective in the direction of a greater range until the plane of optimum image sharpness is in the proximity of the nominal plane in both cells.

According to another feature of the invention in special cases where an optimum operation of the sharpness-dependent photo-conductive cells with a small fine contrast is required for sharp focusing the objective, drifting of the circuit is avoided by vibrating the photoconductive cells in the direction of the beam and by using a phase detector to derive a correction signal from the signal, thus obtained by resistance variation.

In such an arrangement we still have a relative resistance increase of 6% with a fine contrast of $k=2$, so that even sharper focusings far below the response threshold of the human eye, whose capacity of evaluating sharpness is very low with these small contrast values can be realized by using the correcting signal produced from the resistance variation caused by mechanical oscillations.

An effect similar to dividing a row-type photoconductive cell into individual elementary or incremental regions is achievable according to another feature of the invention, by arranging a number of photosensitive elements, for example, photo diodes or photo transistors, in mosaic-fashion and connecting them in series to form a voltage divider with a working resistance between the voltage source. The divider centers are connected by gate diodes to a load resistance common to all voltage dividers to generate the control signal. Preferably small discrete photosensitive elements with a square cross section are arranged in rows side by side. All voltage dividers are connected parallel to each other. Silicon photo diodes are particularly suitable as photosensitive elements.

According to another feature of the invention, and in order to obtain a maximum modulation range, so-called potential-equalizing diodes are arranged in the voltage dividers so that their pass direction is oppositely directed to that of the photosensitive elements.

According to another feature of the invention, the photo diodes, the gate diodes, the working resistances, and the load resistance form an OR-gate so that a maximum voltage on the load resistance occurs with maximum or minimum imaged detail brightness.

According to another feature of the invention the photo diodes, gate diodes, working resistance and the load resistance are connected to form an AND-gate so that a minimum voltage occurs on the load resistance with maximum or minimum image detail brightness.

The diode arrangement, which generates a maximum voltage with minimum image detail brightness, is analogous to a thermal PTC resistance, namely a cold conductor which operates as a dark conductor, rather than using photoconductive cell arrangements which act as light conductors. All circuits according to the invention, particularly the arrangement of the photoconductive cells according to the invention, are produced in the form of integrated circuits, which require a minimum of space, permit a simple and cost-saving series production, so that they are sutiable for inexpensive and rugged miniature cameras, even for amateurs.

The photoconductive cells according to the invention, however, are not only suitable for the motor control of objectives. They also permit the production of devices for the electrical indication of optimum image sharpness.

In this connection the invention opens up additional possibilities, for example, for the production of an arrangement for automatic passive range finding where, in contrast to the presently known radar method, no separate transmitter is required since the distance of objects can be determined on the basis of the sharpness of definition measured in various image distances, as long as there is sufficient light and visibility.

These passive range finders are suitable among others for the continuous measurement of distances between moving objects, for example, motor vehicles, so that the danger of collisions can be reduced.

Another feature of the present invention is to offer a very compact photoelectrical transducing unit consisting of two or more than two photoelectric transducers and presenting a disposition very easy to adjust.

Another object of the present invention is to offer a photoelectric transducing unit capable of detecting the sharpness of an image with high accuracy by combining two photoelectric transducers presenting different output characteristics from each other.

Further another object of the present invention is to offer a photoelectric transducing unit with a combined disposition of a series type photoelectric transducer and a parallel type photoelectric transducer, whereby their output characteristics are different from each other.

Further another object of the present invention is to compose a photoelectrical transducing unit by combining two photoelectric transducers presenting a bifilar-spiral construction in the photosensitive layers and the electrodes.

Further another object of the present invention is to compose a photoelectric transducing unit, by combining a series type photoelectric transducer consisting of a photosensitive layer of a fine, long, belt-shaped, bifilar-spirally wound photoelectric semiconductor and of electrodes provided at both ends of the belt-shaped photoelectric conductor and a parallel type photoelectric transducer consisting of counter electrodes of two fine, long, belt-shaped, bifilar-spirally wound conductor pieces and of a photosensitive layer of photoelectrical semiconductor electrically connected with the counter electrode in such a manner that the counter electrodes in the parallel type photoelectric transducer do not overlap the photosensitive layer in the series type photoelectrical transducer.

Further, another object of the present invention is to compose a photoelectrical transducing unit, by combining a series type photoelectric transducer consisting of a photosensitive layer of a fine, long, belt-shaped, bifilar-spirally wound photoelectric semiconductor and of electrodes provided at both ends of the belt-shaped photoelectric semiconductor and a parallel type photoelectric transducer consisting of counter electrodes of two fine, long, belt-shaped, bifilar-spirally wound conductor pieces and of a photosensitive layer of photoelectric semiconductor electrically connected with the counter electrodes in such a manner that the photosensitive layer in the series type photoelectric transducer overlaps the counter electrodes in the parallel type photoelectrical transducer.

Further, another object of the present invention is to compose a photoelectrical transducing unit of two photoelectrical transducers (photosensitive elements) in such a manner that the light beam directly reaches the one (front side) photoelectric transducer, passes the permeable zone of the (front side) photoelectrical transducer and reaches the photosensitive layer of the other (back side) photoelectrical transducer.

The further another purpose of the present invention is to offer a combination of the two sets of the photoelectrical transducing units with highest permeability shifted by ±δ/2 to the optical axis for the position where the resolving power is maximum, without the light beam splitting by means of a semipermeable light beam splitting means or a prism, disposed optically in continuation and enabling a differential disposition necessary for the automatic focussing by means of the photoelectrical transducers reacting to the contrast.

Further another object of the present invention is to offer a system for detecting the sharpness of the image of object by means of a or more than one above mentioned photoelectric transducing units.

Further another object of the present invention is to apply the above mentioned system for detecting the sharpness of the image of object to the focus detecting equipment and/or the automatic focus adjusting equipment for the optical instrument such as photographing camera, motion picture camera and so on.

These and other features of the invention are pointed out in the claims. Other objects and advantages of the invention will become evident from the following detailed description when read in light of the accompanying drawings.

BRIEF DESCRIPTION OF THE DRAWINGS

FIG. 6b is a graph illustrating the dependence of the illumination on particular sites in FIG. 10a;

FIG. 1' shows a spatial disposition of the photoelectrical transducing unit according to the present invention in perspective view.

FIG. 2' shows the first and the second embodiment of the correlative disposition of the photosensitive layers (photoelectric semiconductor) as well as of the electrodes, whereby FIG. 2a' and FIG. 2b' respectively show the form of the photosensitive layer 7' of the first photoelectric transducer 1' and that of the counter electrodes 8', 9' of the second photoelectric transducer 3 of the first embodiment while FIG. 2c' and FIG. 2d' respectively show the form of the photosensitive layer 7' of the first photoelectrical transducer 1' and that of the counter electrodes 8', 9' of the second photoelectrical transducer 3' of the second embodiment.

FIG. 3 shows in sketch the mutual relation of the correlative disposition of the photosensitive layer 7' and the counter electrodes 8', 9' of the first and the second embodiment, whereby the mutual relation of the correlative disposition of the photosensitive layer 7' and the counter electrodes 8', 9' shown in FIG. 2' can be understood easily when the drawing is folded along the line 10', namely FIG. 3a' and FIG. 3c' respectively show the form of the photosensitive layer 7' whose spiral direction is reversed to that of the photosensitive layer 7' shown in FIG. 2a' and FIG. 2c' (corresponding to the case when FIG. 2a' and FIG. 2c' are seen from the back side of the drawing) while FIG. 3b' and FIG. 3d' respectively show the form of the counter electrodes 8', 9' shown in FIG. 2b' and FIG. 2d'.

FIG. 4' is the partial enlargement of the above mentioned first photoelectrical transducer 1', whereby FIG. 4a' shows a plane view while FIG. 4b' shows a sectional view.

FIG. 5' shows the partial enlargement of the above mentioned second photoelectrical transducer 3', whereby

FIG. 6' shows the partial section of the joined state of the photoelectrical transducing unit shown in FIG. 1', in enlargement whereby FIG. 6a' shows the first embodiment shown in FIG. 2a' and FIG. 2b' while FIG. 6b' shows the second embodiment shown in FIG. 2c' and FIG. 2d'.

FIG. 7' shows in sketch the fundamental disposition of the important part of the optical instrument according to the present invention so constructed as to be able to detect the focussing of the optical instrument by detecting the sharpness of the image formed by the optics by means of one of the above mentioned photoelectrical transducing unit.

FIG. 8' shows an electrical circuit of the fundamental disposition of the signal processing circuit 31' in the optical instrument shown in FIG. 7.

FIG. 9' shows the disposition of the important part of an embodiment of the photographic camera capable of automatic focussing in which the fundamental disposition of the optical instrument shown in FIG. 7 is made use of.

FIG. 10' shows an electrical circuit of the fundamental disposition of the control unit 31" in the camera $C_1'$ shown in FIG. 9'.

FIG. 11' shows the output wave forms for showing the variation of the output signals according to the elapse of the time, out of the wirings 47', 48', 49' and 50' of the electrical circuit shown in FIG. 10'.

FIG. 12' shows in sketch the first embodiment of the disposition of especially two photoelectrical transducing units in an optical instrument so constructed as to be able to automatically adjust the focussing of the optics by detecting the sharpness of the image of the object formed by the optics by means of the above mentioned two photoelectrical transducing units.

FIG. 13' shows in sketch the second embodiment of the disposition of especially two photoelectrical transducing units in an optical instrument so constructed as to be able to automatically adjust the focussing of the optics by detecting the sharpness of the image of the object formed by the optics by means of the above mentioned two photoelectrical transducing units.

FIG. 14' shows the important disposition of an embodiment of the photographic camera capable of the automatic focussing in which the fundamental disposition of the optical instrument shown in FIG. 12' is made use of.

DETAILED DESCRIPTION OF PREFERRED EMBODIMENTS

Figure 1:
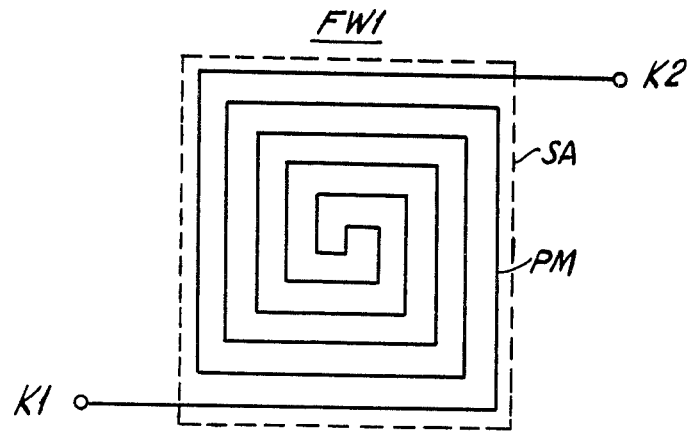
FIG. 1 is a schematic diagram illustrating a plan view of a photoconductive cell embodying features of the invention and having the shape of a rectangularly arranged bifilar spiral with connections outside the sensing area.

In FIG. 1, an elongated photoconductive material PM follows a bifilar spiral form and ends in exterior electrical terminals K1 and K2. The material forms a photoresistor or photoconductive cell FW1 whose sensing area SA is defined by the phantom lines. The material PM is illustrated as unidimensional for convenience.

However, it should be noted that the elongated material has a depth as well as width and is packed within the sensing area to achieve maximum density. However, each increment is electrically connected to the adjacent increments only along the direction of elongation but is insulated from the adjacent "turns" of the bifilar path. It is this separation which is more clearly visible by showing the material PM as being unidimensional.

According to an embodiment of the invention, the material PM is composed of a single length of properly arranged material in the form of a thin coat.

According to another embodiment of the invention, the material PM is composed of a plurality of series connected individual photosensitive members either long or short.

It has been discovered that a cell such as FW1 exhibits a higher electrical resistance when a sharp image is focused upon the sensing area SA than when a blurred image is focused on the same sensing area. This arises in part because the cell FW1 exhibits a lower resistance to high contrast light changes along any length in the longitudinal direction of the material PM. The explanation for this phenomenon is described at a later point.

Figure 2:
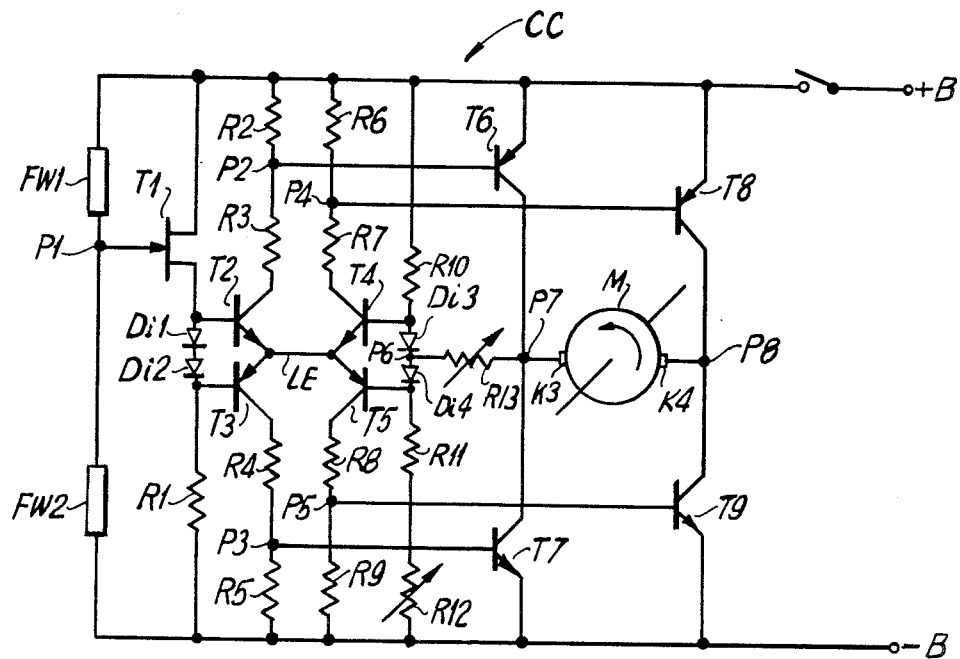
FIG. 2 is a schematic diagram illustrating a circuit embodying features of the invention and utilizing two photoconductive cells similar to those in FIG. 1 for automatically focusing an objective in a camera.
Figure 1:
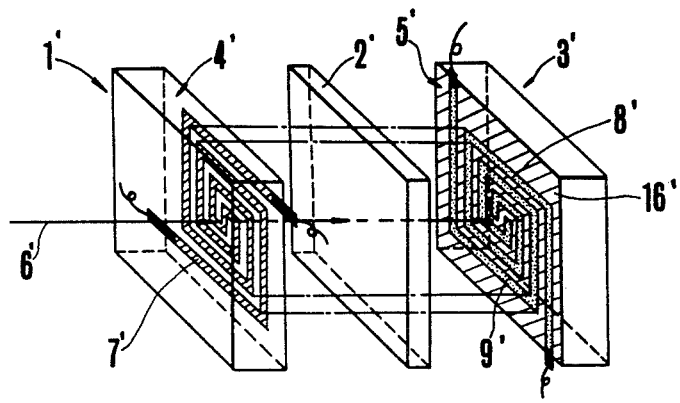
Figure 3:
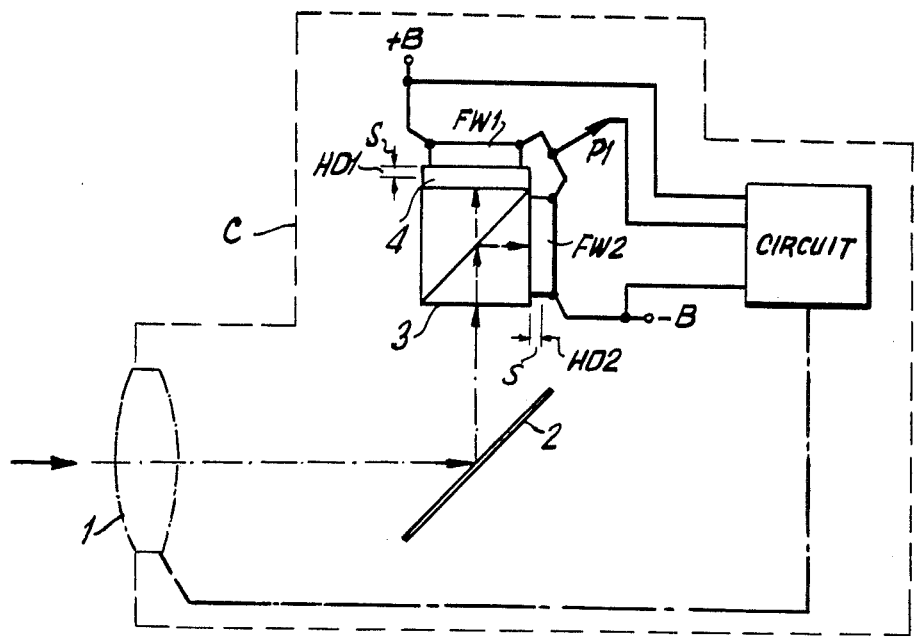
FIG. 3 is a schematic view of a portion of the camera utilizing the circuit of FIG. 2 and the cells of FIG. 1 and specifically showing the placement of the cells and the manner in which they receive light from the optical path through the objective.

In FIG. 2 the photoresistor or cell FW1 and an identical photoresistor or cell FW2 cooperate to control a motor M which drives an objective 1 of a camera C as shown in FIG. 3. In FIG. 2, the circuit of FIG. 2 is identified as CC. Here, light passing through the objective 1 strikes a mirror 2 which deflects the light to a beam splitting prism 3. The latter splits the beam evenly and applies it to the photoconductive cell FW2 whose forward sensing surface is mounted directly on the surface of the beam splitter 3. The light traveling toward the cell FW1 passes through a transparent spacer plate separating the light sensing front surface of the cell FW1 from the prism 3 by a predetermined distance. The cell FW1 and the plate 4 are mounted on the prism 3 together with the cell FW2. The plate 4 effectively extends the distance of the sensing surface of the cell FW1 from the objective 1 relative to the distance from the objective 1 from the sensing cell FW2.

The prism 3 holds the cells FW1 and FW2 at positions such that when the objective 1 focuses sharply on the film, i.e. the desired focal plane, it also focuses sharply upon a first high definition plane HD1 passing through the plate 4 and located a distance S ahead of the photosensitive surface of the cell FW1 equal to half the thickness of the plate 4. At the same time the objective 1 focuses upon a high definition plane HD2 a distance equal to S behind the light sensitive surface of the photoresistor FW1.

The material PM in FIG. 1 is preferably in the form of a light-sensitive coat so that its thickness or depth is minimal.

Thus during sharp focusing, sharp images appear at a distance $S=1/2$ the thickness of the plate 4 ahead of the photosensitive coat of the cell FW1 and the same distance behind the corresponding coat of the photoresistor FW2.

As mentioned, the cells FW1 and FW2 are connected in the circuit CC as shown in FIG. 2. Here, the two photoconductive cells FW1 and FW2 form a voltage divider between the positive and negative terminals plus B and minus B of a voltage source.

The voltage divider point P1 between the cells controls the gate of a field effect transistor T1. The latter is connected as a source follower, i.e. a drain switch, with a resistor R1 and two diodes Di1 and Di2 so as to exhibit a high-ohmic input resistance and thereby avoid undesired loading of the high resistance photoconductive cells FW1 and FW2, whose resistances are of the order of a megohm each.

The divider circuit renders the divider point P1 virtually independent of over several decimal powers of illumination changes when the conductive cells are illuminated equally.

The source follower connected field effect transistor T1 operates a double push-pull driver composed of complementary transistors T2, T3, T4, and T5 as well as resistors R2 to R9.

Two pairs of series connected diodes, namely pair Di1 and Di2 and pair Di3 and Di4, generate the necessary base bias voltages between the bases of the driver transistors T2 and T3 on the one hand, and T4 and T5 on the other. The first pair of diodes Di1 and Di2 appear in the path of main current flow of the field effect transistor T1. The second pair of diodes Di3 and Di4 appear between the terminals $+B$ and $-B$ interposed between divider resistors R10, R11, and R12. The resistor R12 is variable and serves as a trimming resistor so that the circuit can be adjusted for symmetry. Resistors $R_2$ to $R_9$ bias the transistors.

The driver stage drives an output or power double push-pull circuit composed of complementary transistors T6, T7, and T8, T9 whose bases are coupled with the circuit points P2, P3, and P4, P5, of the driver stage. The power stage energizes a DC motor M connected across opposite points P7 and P8 of the bridge formed by the driver stage. The motor M drives the objective 1 as shown in FIG. 3. A variable feedback resistor R13 connects the switching point P7 to a switching point P6 between the diodes Di3 and Di4.

In operation, the field effect transistor P1 of FIG. 2 controls the bases of the double push-pull driver stage in such a way that only one pair of diagonally opposed complementary transistors is opened. These transistors in turn open the complementary transistors of the respective diagonals in the double push-pull connection of the power transformers.

If the objective of FIG. 3 is directed onto an object, and a sharper image appears on the photoconductive cell FW2 than on the photoconductive cell FW1, the resistance of photoconductive cell FW2 will exceed that of cell FW1. This raises the potential of the voltage dividing point P1 and hence the gate potential of the field effect transistor T1. The source voltage which is dependent upon the gate voltage and which exceeds the gate voltage by the pinch-off voltage of about one volt, similarly increases and opens the transistor T2. The emitter line LE common to all four driver transistors T2 to T5 opens the PNP transistor T5. This action turns on the PNP power transistor T6 and the NPN power transistor T9 and connects the terminal K3 of the motor M to the positive pole and the terminal K4 to the negative pole of the voltage source B. The DC motor rotates in the direction determined by the polarity of the supply voltage. It drives the range finder of the objective through a reduction gear not shown until both photoconductive cells FW1 and FW2 exhibits the same resistance values.

As was previously stated the objective 1, when it produces a sharp image on the focal plane of the camera, produces sharp images in the planes HD1 and HD2. This produces an approximately equally blurred or sharp image on each of the cells FW1 and FW2. When the objective 1 is moved forward within the camera, thereby blurring the image in the focal plane, one focus control image departs from the plane HD1 and moves further from the sensing surface of the cell FW1, while the other image departs from the plane HD2 and moves closer to the sensing surface of the cell FW2. Under these circumstances the cell FW2 is subjected to a sharper image than the cell FW1 and thereby exhibits a higher resistance. If the objective 1 is moved closer to the focal plane than the ideal focusing position, the image projected upon the cell FW1 is sharper than the image projected upon the cell FW2. Thus the cell FW1 exhibits the higher resistance. Since the motor M moves the objective 1 toward the position of equality of the two resistances of the cells, the objective 1 ultimately reaches the position corresponding to the one in which it focuses precisely upon the camera's focal plane.

In the case described with respect to FIG. 2, a sharper image is produced on the coat of the photoconductive cell FW2 than on the coat of the photoconductive cell FW1. In this case the plane of optimum definition before adjustment is closer to the coat of photoconductive cell FW2 than to the coat of photoconductive cell FW1, that is, it has moved in the direction of the objective.

This means that the image distance is small and that the object is farther away from the objective of the camera than the momentary required distance for sharp focusing. Thus, the motor moves the objective in the direction of a greater distance until the images are again in the vicinity of the nominal planes HD1 and HD2 of the photoconductive cells FW1 and FW2, with the exception of a residual error. This produces sharp focusing.

Figure 4:
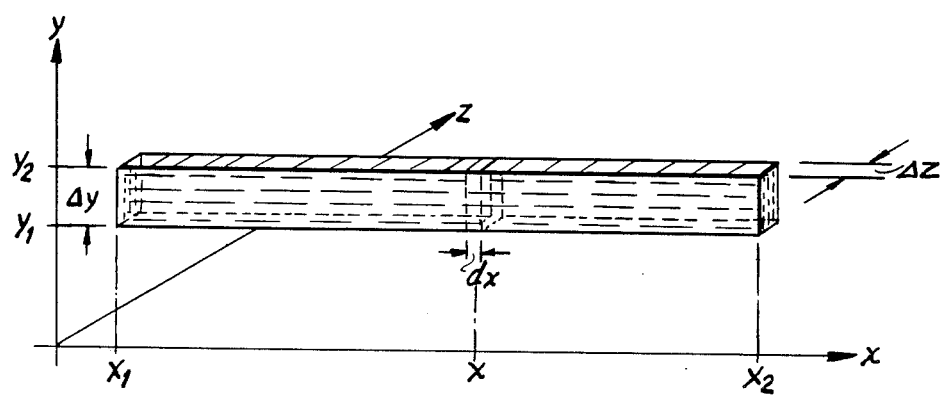
FIG. 4 is a perspective view of a row of photoconductive cells located in a coordinate system for the purpose of analyzing the operation according to the invention.

The principles upon which operation of the cells FW1 and FW2 in FIGS. 1 to 3 operate, as well as the dimensioning rules for making each photoconductive cell definition-sensitive according to the invention will be described with respect to FIGS. 4 to 10. For the purpose of this analysis, one horizontal strip of the photoconductive material PM in the cell FW1 is considered. It is assumed that a photographic objective produces a substantially sharp image of an original on the surface of the photoconductive cell, and that along the horizontal strip the image is composed of a periodic arrangement of vertical bands with an illumination distribution varying periodically along the horizontal. FIG. 4 shows such a strip having a rectangular cross-section within a coordinate system. The illumination distribution varies in the direction of the X axis.

The rectangle of FIG. 4 has the dimensions shown, namely
Width: $\Delta y = y_2 - y_1$
Length: $\Delta x = x_2 - x_1 = \int dx$
Thickness: $\Delta z = z_2 - z_1$ The number of light-dark periods per mm of the curtain pattern reproduced by the objective on this photoconductive cell layer, that is, the spatial frequency n, is selected so that at least one full period falls on the rectangular photoconductive cell layer. The electrical behavior of this arrangement may be considered by calculating the mean resistance $\overline{R}_x$ per period by integrating over such a period.

At any instant, when an object is sharply focused upon the photoconductive material, the illumination distribution, i.e. the brightness, along the horizontal axis varies according to the following function $$B(x) = a + b \sin(2\pi n x) \quad \text{(lux)}$$

where
a = the mean value of the illumination, and
b = the amplitude of the illumination variations,
assuming $$|b| < |a|.$$

Maximum and minimum illumination values appear at the following points of the pattern. Particularly maximum illumination equal to $$B_{max} = a + b \quad \text{(lux)}$$

occurs at points $$2\pi n x = +\frac{\pi}{2}; +\frac{5\pi}{2}; -\frac{3\pi}{2} ,...$$

Minimum illumination $$B_{min} = a - b \quad \text{(lux)}$$

occurs at points $$2\pi n x = -\frac{\pi}{2}; -\frac{3\pi}{2}; = +\frac{9\pi}{2} ,...$$

The fine contrast of this pattern is defined by the ratio of the maximum to the minimum illumination, namely, $$k = \frac{B \max}{B \min} = \frac{a+b}{a-b} = \frac{1+\frac{b}{a}}{1-\frac{b}{a}}$$

Thus, the fine contrast, and hence the definition, depend on the ratio of the amplitude variation b to the mean value a in such a way that both increase with increasing amplitude variation b.

Each optical system, hence the objective lens, acts like a low-pass filter having a maximum bandwidth at maximum definition.

Figure 5:
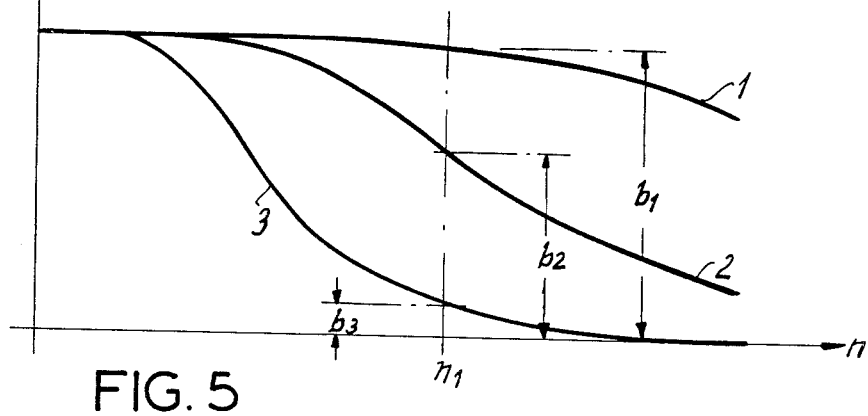
FIG. 5 is a graph illustrating the dependence of the variation of amplitude of the illumination on the spatial frequency for three difference image qualities.

FIG. 5 illustrates the influence of this low-pass filter characteristic on the amplitude of the variations (alternation amplitude) b with the selected spatial frequency $n_1$ of the pattern for three different fine contrast values 1, 2, and 3. This calculation is also started with an elongated rectangular photoconductive cell, or portion of a cell, or a so-called photoconductive cell row, as shown in FIG. 4. Here the elementary or differential region has the following volume at the point x.

$$dV = \Delta Y \cdot \Delta z \cdot dx \quad \text{(in mm}^3\text{)}$$

where the layer width is $$\Delta Y = Y_2 - Y_1 \quad \text{(in mm)}$$

The layer thickness is $$\Delta z = z_2 - z_1 \quad \text{(in mm)}$$

For this calculation it is assumed that the light is directed perpendicularly onto the photoconductive cell in the direction of the z axis.

Each elementary or differential region has a specific local conductance $\sigma(x)$. This specific conductance is, as a first approximation, directly proportional to the illumination B(x) at that location. With the previously mentioned indicated changes in illumination on the surface of the photoconductive cell, this specific conductance, $$\sigma(x) = q^{B(x)} \text{ (in Ohm}^{-1}\text{ mm}^{-1})$$

where q denotes the sensitivity of the photoconductive coat in.
Ohm$^{-1}$ mm$^{-1}$ lux$^{-1}$ or Mho/(mm.lux)

From the above, the distribution of the illumination B(x) is $$\sigma(x) = qa + qb \sin(2\,nx) \text{ (in mho/mm)}$$

In the above equation, qa is the mean specific conductance while qb is the amplitude of the sinusoidal variation of the specific conductance, and n is the spatial frequency in periods per mm.

Figure 7:
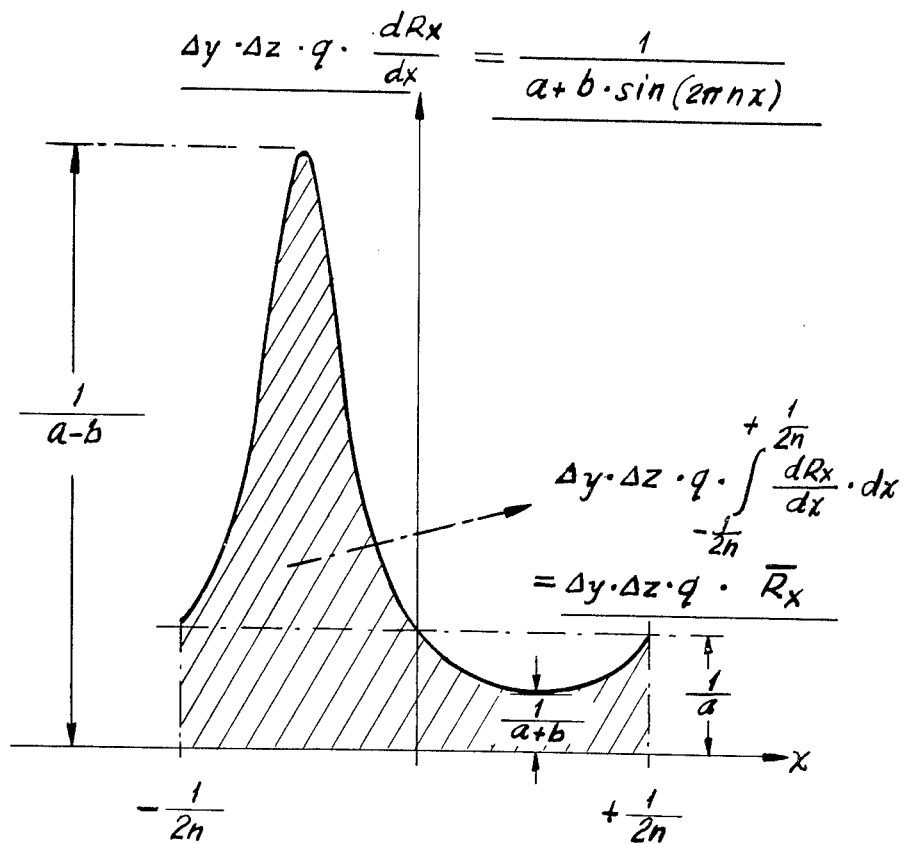
FIG. 7 is a graph illustrating the dependence of the electrical resistance of an elementary or incremental region in the X direction at the site X.

The resistance $dR_x$ of one of the series connected differential or elementary regions measured in the x direction as shown in FIG. 7 is $$dR_x = \frac{dx}{\Delta y \cdot \Delta z \cdot \sigma(x)} = \frac{dx}{\Delta y \cdot \Delta z \cdot q \cdot (a + b \cdot \sin(2\pi nx))}$$

The conductance of one of the differential region, as illustrated in FIG. 5, is $$dG_y = \frac{\Delta z \cdot \sigma(x) \cdot dx}{\Delta y} = \frac{\Delta z \cdot q}{\Delta y} \cdot (a + b \cdot \sin(2\pi nx)) \text{ [Ohm}^{-1}]$$

This conductance is, of course, connected in parallel to the conductances of the adjacent differential volumes.

In the direction of the X axis, the partial or differential resistances $dR_x$ of the differential regions add up, between the points $x_1$ and $x_2$, to a total resistance $$R\,x_{ges} = \int_{x_1}^{x_2} dR_x =$$

$$\frac{1}{\Delta y \cdot \Delta z \cdot q} \cdot \int_{x_1}^{x_2} \frac{dx}{(a + b \cdot \sin(2\pi nx))} \text{ [Ohm]}$$

Of particular interest in this periodic distribution of illumination B(x) is the mean resistance $R_x$ per period with $\alpha = 2\pi nx$, and the period of this argument $-\pi \leq \alpha \leq \pi$ we obtained $$dx = \frac{d\alpha}{2\pi n}$$

$$\bar{R}_x = \frac{1}{\Delta y \cdot \Delta z\, q} \int_{-\frac{1}{2\eta}}^{\frac{1}{2\eta}} \frac{dx}{(a + b \cdot \sin(2\pi nx))} \text{ [Ohm]}$$

The transformation $$x \to \alpha$$

$$\bar{R}_x = \frac{1}{2\pi n \cdot \Delta y \cdot \Delta z \cdot q} \int_{-\pi}^{+\pi} \frac{d\alpha}{(a + b \cdot \sin\alpha)} \text{ [Ohm]}$$

The above integral is solved as follows $$\int_{-\pi}^{+\pi} \frac{d\alpha}{(a + b \cdot \sin\alpha)} =$$

$$\frac{2}{\sqrt{a^2 - b^2}} \arctan\left(\frac{a \cdot \tan(\frac{\alpha}{2}) + b}{\sqrt{a^2 - b^2}}\right)$$

Because of the singularity of $\tan(\alpha/2)$ when $\alpha_1 = -\pi$, and $\alpha_2 = +\pi$, the integral is first solved for $\alpha_1 >$ $-\pi$; $\alpha_2 < +\pi$ and then the passage to the limit $\alpha_2 \to -\pi$; $\alpha_2 \to \pi$ is effected. Thus $$\int_{-\pi}^{+\pi} \frac{d\alpha}{(a + b \sin\alpha)} = \lim_{\substack{\alpha_1 \to -\pi \\ \alpha_2 \to +\pi}} \int_{\alpha_1}^{\alpha_2} \frac{d\alpha}{(a + b \sin\alpha)}$$

$$= \lim_{\substack{\alpha_1 \to -\pi \\ \alpha_2 \to +\pi}} \frac{2}{\sqrt{a^2 - b^2}} \left\{ \arctan\left(\frac{a \cdot \tan(\frac{d_2}{2}) + b}{\sqrt{a^2 - b^2}}\right) - \right.$$

$$\left. \arctan\left(\frac{a \cdot \tan(\frac{d_1}{2}) + b}{\sqrt{a^2 - b^2}}\right) \right\}$$

$$= \lim_{\substack{\alpha_1 \to -\pi \\ \alpha_2 \to +\pi}} \frac{2}{\sqrt{a^2 - b^2}} \left\{ \arctan\left(\frac{a \tan(\frac{d_2}{2}) + b}{\sqrt{a^2 - b^2}}\right) + \right.$$

$$\left. \arctan\left(\frac{a \tan(\frac{|d_1|}{2}) - b}{\sqrt{a^2 - b^2}}\right) \right\}$$

In the passage of the limits $\alpha_1 \to -\pi$; $\alpha_2 \to \pi$, the integration limits ($\alpha_1$, $\alpha_2$) causes the values $\tan(|\alpha_1|/2)$ and $\tan(\alpha_2/2)$ to increase drastically, so that the summand b can be neglected and both arctan functions tend toward the same limit value $\pi/2$.

Thus:

$$\lim_{\alpha_2 \to +\pi} \arctan\left(\frac{a \cdot \tan(\frac{\alpha_2}{2}) + b}{\sqrt{a^2 - b^2}}\right) = \frac{\pi}{2}$$

$$\lim_{\alpha_1 \to -\pi} \arctan\left(\frac{a \cdot \tan\frac{|\alpha_2|}{2} - b}{\sqrt{a^2 - b^2}}\right) = \frac{\pi}{2}$$

The solution of the integral then reads $$\int_{-\pi}^{+\pi} \frac{d\alpha}{(a + b \cdot \sin\alpha)} = \frac{2\pi}{\sqrt{a^2 - b^2}}$$

Hence, the mean resistance $\bar{R}_x$ per period is $$\bar{R}_x = \frac{1}{n \cdot \Delta y \cdot \Delta z \cdot q \cdot \sqrt{a^2 - b^2}} =$$

$$\frac{1}{n \cdot \Delta y \cdot \Delta z \cdot q \cdot \sqrt{1 - (\frac{b}{a})^2}} \text{ [Ohm]}$$

The mean resistance $\bar{R}_x$ depends upon the ratio of the amplitude b of the variation to the mean value a of the illumination B(x) according to the following equation:

$$\bar{R}_x = \frac{K}{\sqrt{1 - (\frac{b}{a})^2}} \text{ [Ohm]}; \quad K = \frac{1}{n \cdot a \cdot \Delta y \cdot \Delta z \cdot q}$$

According to other embodiments of the invention, the cells FW1 and FW2 of FIGS. 1 and 2 are formed of a plurality of photo diodes arranged as a mosaic in the image plane along the bifilar paths and connected to each other so as to form an OR gate or an AND gate which generates a control signal on a common load resistance in dependence on the image detail brightness.

Examples of such embodiments are shown in FIGS. 11 to 14.

Figure 11:
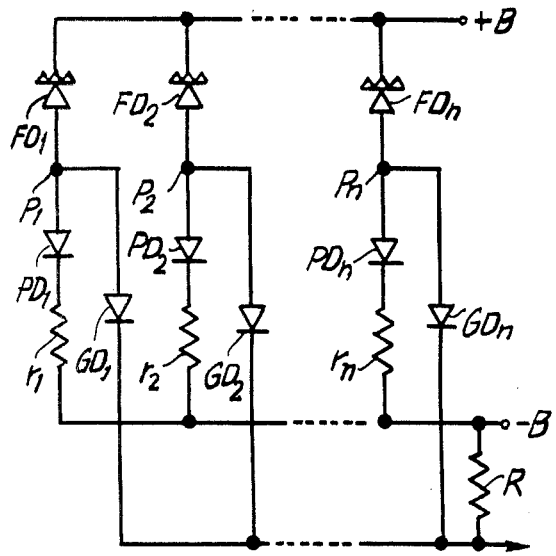
FIG. 11 is a schematic diagram illustrating a circuit embodying features of the invention, which circuit utilizes photo diodes arranged as a mosaic and connected to form an OR-gate for maximum image detail brightness.

In FIG. 11 an OR gate is composed of n voltage dividers. The first voltage divider is composed of a series connected photo diode $FD_1$, potential equalizing diodes $PD_1$ and operating resistances $r_1$ all arranged between the terminals $+B$ and $-B$ of a voltage source. The remaining voltage dividers include photo diodes $FD_2 \ldots FD_n$, equalizing diodes $PD_2 \ldots PD_n$ and working resistances $r_2 \ldots r_n$. The forward direction of the photo diode is opposite to the forward direction of the potential equalizing diodes. Respective gate diodes $GD_1, GD_2 \ldots GD_n$ connect divider points $P_1, P_2 \ldots P_n$ to the load resistance R which is common to all the gate diodes. The load resistance is connected between the gate diodes and the negative terminal $-B$ of the source.

For simplicity the photo diodes will be referred to as FD, the potential equalizing diodes PD, the gate diodes GD, the operating resistances r, and the points P without their subscripts.

In this OR circuit the photo diode FD whose light sensitive coat receives the greatest illumination exhibits the lowest resistance. The potential of the corresponding divider point P is then highest, that is, most positive. This potential then determines the output potential of the OR circuit which therefore assumes its maximum value at optimum definition, due to the fact that it is then that the image detail brightness is greatest.

Figure 12:
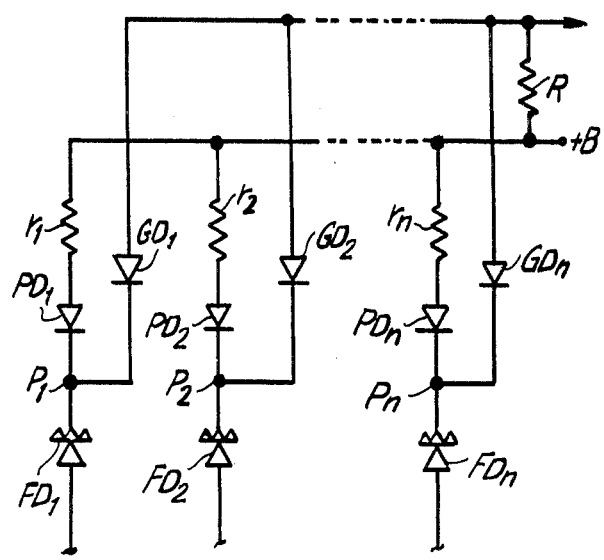
FIG. 12 is a schematic diagram illustrating a circuit embodying features of the invention, which circuit utilizes photo diodes arranged as a mosaic and connected to form an AND-gate for maximum image detail brightness.

In contrast to this circuit, the circuit of FIG. 12 operates as an AND gate where the maximum image detail brightness produces the lowest voltage drop on the resistance R. Here, like reference characters designate like parts. Within each voltage divider current passes from the positive terminal $+B$ of the source through the operating resistor r, the potential equalizing diode PD, and the photo diode FD. A gate diode GD connects the divider point P to the load resistor R whose other side is connected to the positive terminal $+B$ of the source.

Again in this circuit, the photo diode with the greatest illumination determines the output potential but the potential of this voltage divider is lowest, that is, most negative so that the output potential assumes a minimum value at optimal definition. This is so because the image detail brightness is then greatest.

Figure 13:
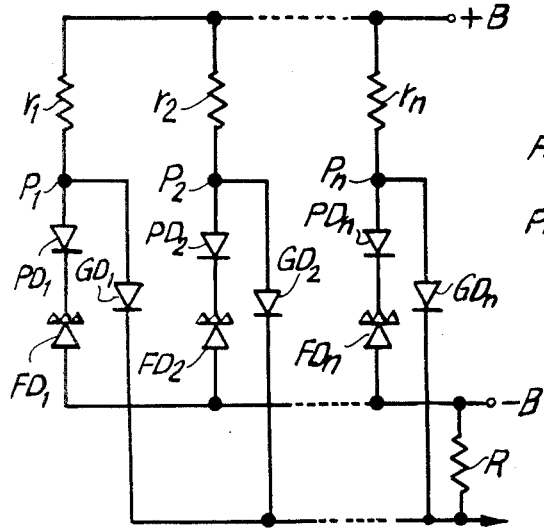
FIG. 13 is a schematic diagram illustrating a circuit embodying features of the invention, which circuit utilizes photo diodes arranged as a mosaic and connected to form an OR-gate for minimum image detail brightness.

FIG. 13 illustrates another version of an OR gate which supplies the maximum output potential with minimum image detail brightness. The voltage dividers forming the elements of the OR gate are composed of the following order of elements, namely operating resistance r, potential equalizing diode PD, and photo diode FD. A gate diode GD again connects the divider point to the resistor R.

In this circuit, the potential is highest at the point P whose corresponding photo diode is subject to least illumination. That is, this point is most positive and determines the output potential of the load resistance R which therefore assumes a maximum value at optimum definition. This is due to the fact that the image detail brightness is then lowest.

Figure 14:
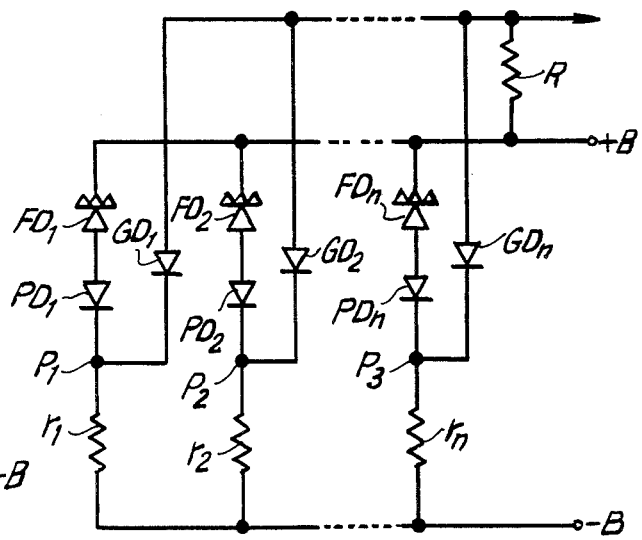
FIG. 14 is a schematic diagram illustrating a circuit embodying features of the invention, which circuit utilizes photo diodes arranged as a mosaic and connected to form an AND-gate for minimum image detail brightness.
Figure 12:
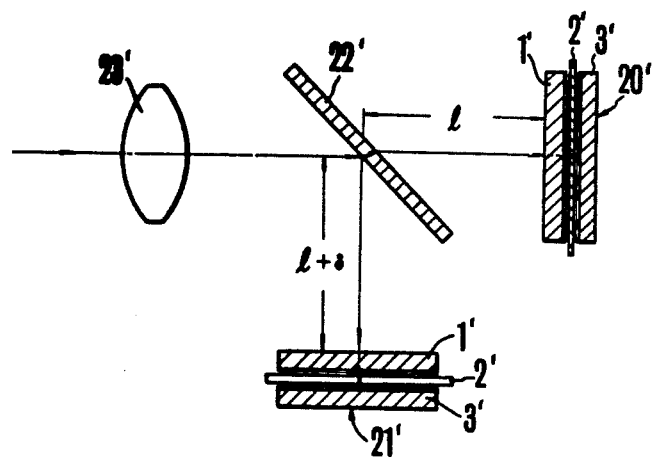
Figure 13:
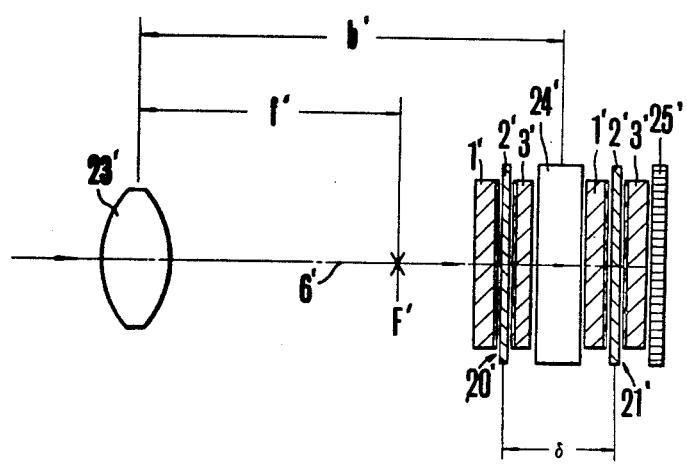
Figure 14:
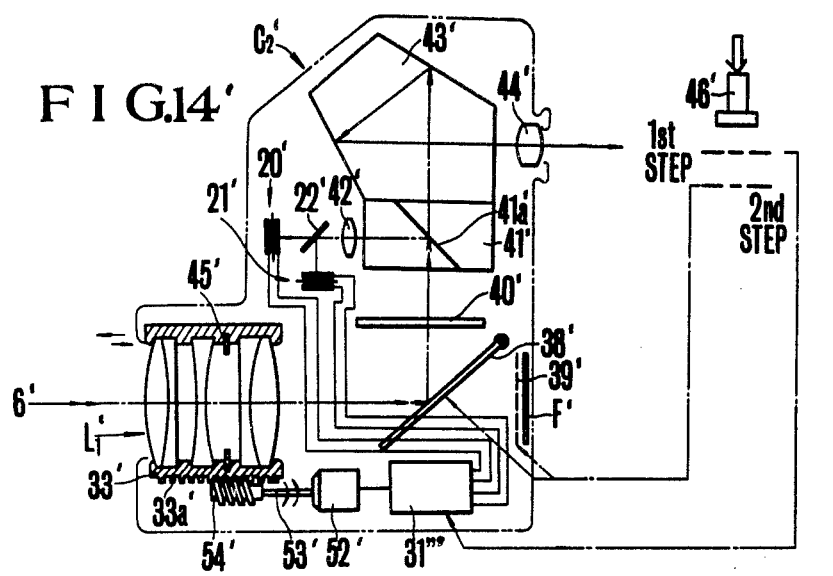

FIG. 14 illustrates another embodiment of an AND gate. Here the output potential assumes a minimum value on the common load resistance R with minimum image detail brightness. The order of the structural elements in the voltage divider has been changed relative to that of FIG. 13. Current flows from the positive terminal $+B$ of the source S through the photo diode FD, the potential equalizing diode PD, the divider point P, and the operating resistor r. Gate diodes GD connect the respective points P to the load resistance R. The potential on the divider point P of the voltage divider whose photo diode is subject to the least illumination is lowest, that is, most negative. This determines the output potential of the AND circuit which therefore assumes a minimum value at optimal definition. This is due to the fact that it is then that the image detail brightness is lowest.

It should be noted that the term "photoconductive cell" is used interchangeably with the term "photoresistor" in the context of this application.

Below several other embodiments of the photoelectrical transducing unit according to the present invention and of the system for detecting the sharpness of the image of object by means of the photoelectrical transducing unit will be explained according to the accompanying drawings.

FIG. 1' shows a fundamental spatial disposition of the photoelectric transducing unit according to the present invention.

For easy understanding the first photoelectric transducer 1', a permeable thin insulation layer 2' and the second photoelectric transducer 3' are shown, being separated from each other, namely in the state before the above mentioned three elements (1', 2', 3') are joined with each other. These three elements (1', 2', 3') are joined with each other to form the photoelectric transducing units as shown in FIG. 5', FIG. 6a' and FIG. 6b'. In this case, the photosensitive layer 7', 8' (consisting of for example CdS or CdSe) of the first and the second photoelectric transducer 1', 3' lies on the back surface 4' of the first photoelectric transducer 1' or on the front surface 5' of the second photoelectric transducer 3'. The permeable insulation layer 2 should be as thin as possible and could be replaced for example, with a permeable thin vaporized foil or resin layer. The light beam passes through each layer of the above mentioned disposition according to the permeability and controls the electrical value of both of the photoelectric transducers 1' and 3'.

Figure 2A:
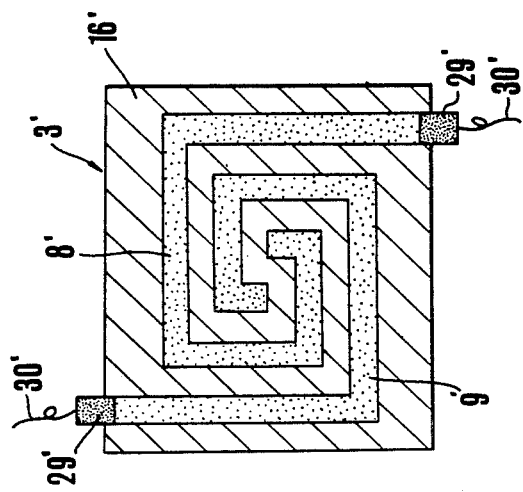
Figure 2B:
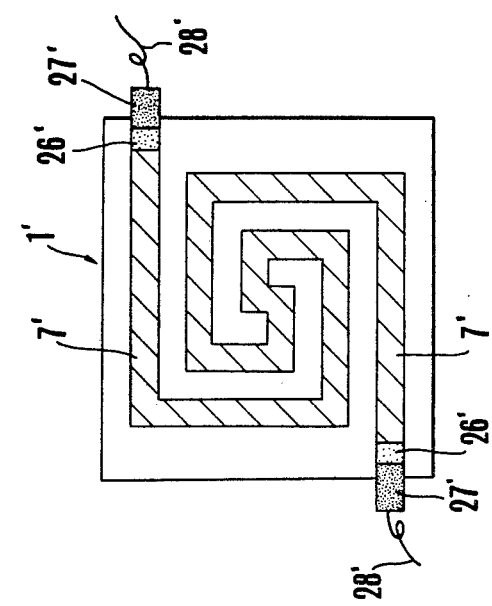
Figure 2C:
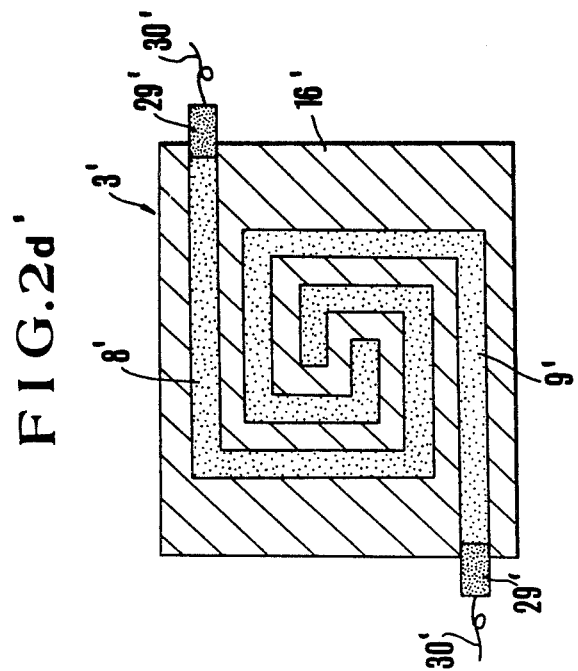
Figure 2D:
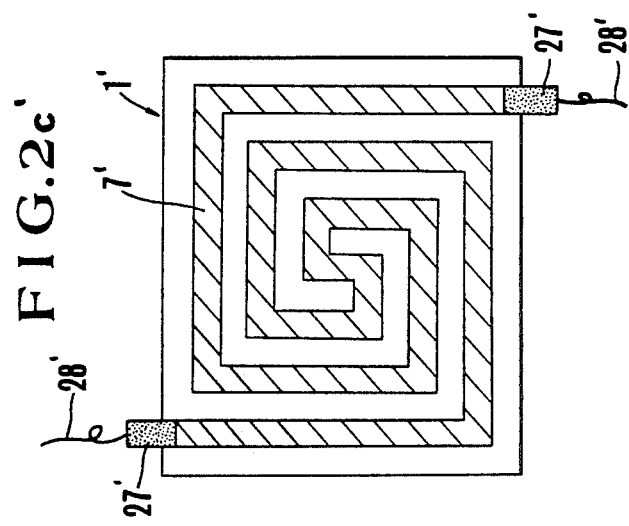

FIG. 2a' and FIG. 2b' as well as FIG. 2c' and FIG. 2d' show the relative disposition of the photosensitive layer (semipermeable body) and the electrodes, whereby FIG. 2a' and FIG. 2b' shows the first embodiment while FIG. 2c' and FIG. 2d' show the second embodiment. FIG. 2a' and FIG. 2c' show the form of the photosensitive layer 7' of the first photoelectrical transducer 1', constructed in such a manner that, as is shown in the drawings, a thin belt-shaped photoelectric semiconductor is wound up bifilar-spirally with the center at the middle of the above mentioned surface 4', whereby at both ends of the photoelectric semiconductor the electrode pieces 26' are provided. The above mentioned first photoelectric transducer 1' presenting the disposition as mentioned above, of the photosensitive layer as well as the electrodes has the efficiency as "series type photoelectric transducer". 27' are the terminals connected to the above mentioned electrode pieces, 28' the lead wires connected to the terminals.

FIG. 2b' and FIG. 2d show the form of a pair of the electrode pieces 8', 9' of the second photoelectric transducer 3', whereby the pair of the electrode pieces 3' are formed in such a manner that two long, thin, belt-shaped conductors are wound up on the photosensitive layer 16' formed all over the above mentioned surface 5', with the center at the middle of the surface 5'. The above mentioned second photoelectric transducer 3 presenting such disposition as mentioned above, of the electrodes as well as the photosensitive layer has the efficiency as "parallel type photoelectrical transducer". 29' is the one terminal of the above mentioned electrode pieces 8', 9', namely the terminal connected to the end close to the circumference of the surface 5', 30' the lead wire connected to the terminal 29'.

Figure 6A:
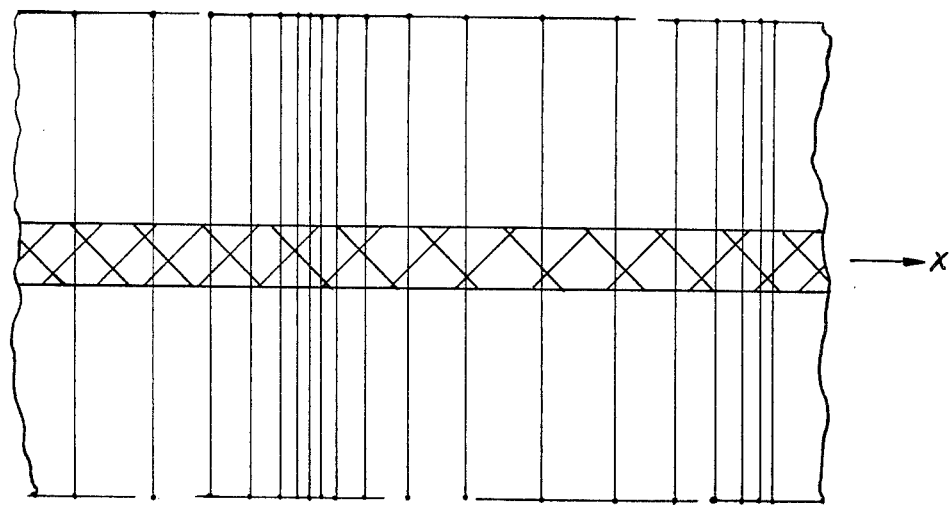
FIG. 6a is a schematic arrangement showing the top view of a row of photoconductive cells utilized according to the invention and shown for the purpose of analyzing the operation.

Hereby the difference between the first embodiment shown in FIG. 2a' and FIG. 2b' and the second embodiment shown in FIG. 2c' and FIG. 2d' lies in the fact that in case of the above mentioned first embodiment the photosensitive layer 7' of the first photoelectric transducer 1' does not overlap the electrode pieces 8', 9' of the second photoelectric transducer 3', namely the electrodes pieces 8', 9' are situated in the space formed by the photosensitive layer 7' when the first photoelectric transducer 1' and the second photoelectric transducer 3' are joined over each other by means of the insulation layer 2' (The then disposition is shown in FIG. 6a' in detail) while in case of the second embodiment the electrode pieces 8', 9' of the second photoelectric transducer 3' overlap the photosensitive layer 7' of the first photoelectric transducer 1', namely the light beam receiving zone of the photosensitive layer 16' of the second photoelectric transducer 3' is situated in the space formed by the photosensitive layer 7' of the first photoelectric transducer 1' (The then disposition is shown in FIG. 6a' in detail).

In consequence in case of the above mentioned first embodiment as will be explained later in detail it is necessary that not only the photosensitive layer 7, 16 should be permeable whereby the total surface 5' should be filled with the photosensitive layer 16' but also the electrode pieces 8', 9' should be processed by metalization so as to be also permeable while in case of the second embodiment it is not always necessary that the photosensitive layers 7', 16' as well as the electrode pieces 8', 9' should be permeable whereby it is sufficient that the photosensitive layer 16' should fill only the space formed by the electrode pieces 8', 9'.

Figure 3A:
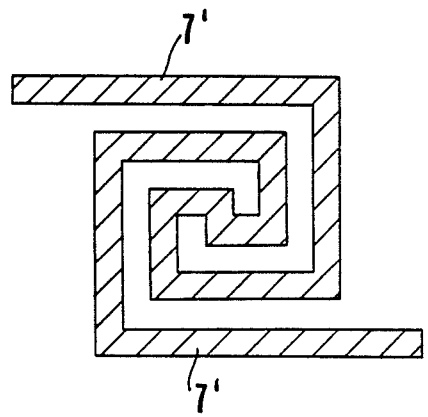
Figure 3A:
Figure 3B:
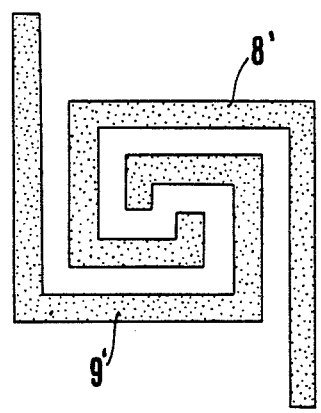
Figure 3C:
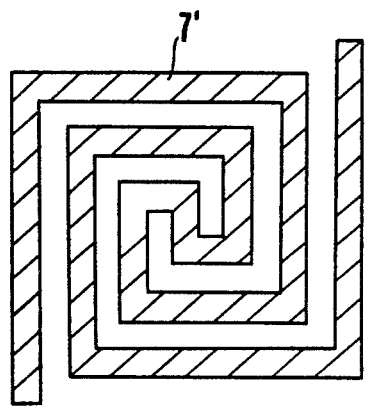
Figure 3C:
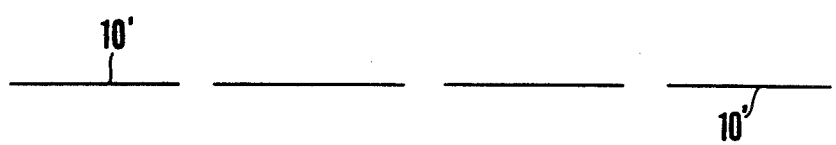
Figure 3D:
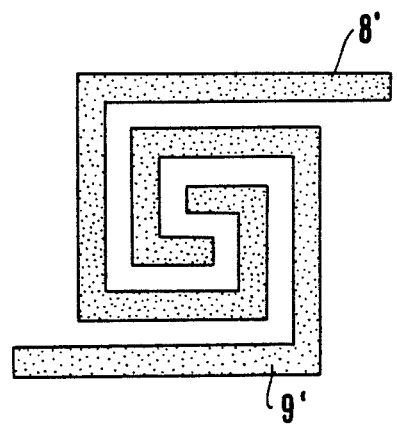

FIG. 3a', FIG. 3b', as well as FIG. 3c', FIG. 3d' show the bifilar-spirally wound photosensitive layer 7' as well as the electrode pieces 8', 9' in principle similar to those shown in FIG. 2a', FIG. 2c' as well as FIG. 2b', FIG. 2d', whereby however, the correlative direction of the rotation of the spiral of each element differs. Namely, the direction of the spiral of the photosensitive layer 7' in FIG. 3a', FIG. 3c' is reversed to that of the photosensitive layer 7' shown in FIG. 2a', FIG. 2c', namely clockwise from outside to inside. (Anticlockwise from outside to inside in FIG. 2a', FIG. 2c'). This corresponds to the mirror image of FIG. 2a', FIG. 2c' respectively. The reason why this disposition corresponding to the mirror image is that the back side 4' of the first photoelectric transducer 1' is illuminated from inside.

The spiral of both of the electrode pieces 8' and 9' in FIG. 3b', FIG. 3d' presents the same direction as that shown in FIG. 2b', FIG. 2d' respectively, whereby the light beam reaches the front surface 5' of the second photoelectric transducer 3' from outside.

By folding FIG. 3a', FIG. 3b' as well as FIG. 3c', FIG. 3d' along the line 10' and putting the upper half over the lower half, the correlative relation corresponding to the above mentioned first and the above mentioned second embodiment of the conjugate bifilar spiral disposition is obtained in the joined state, more particularly, in case of FIG. 3a', FIG. 3b' the relation that the photosensitive layer 7' does not overlap the electrode pieces 8', 9' while in case of FIG. 3c', FIG. 3d' the relation that the photosensitive layer 7' overlaps the electrode pieces 8', 9' can be obtained. What is to be noticed here is the fact that the photosensitive layer 7', 16' of the photoelectric transducers 1', 3' are remarkably thin and directly opposed to each other, only been separated by means of a thin insulation foil 2' so that both of the photosensitive layers 7', 16' lie substantially in the same image plane from the photosensitive layer 7' to the photosensitive layer 16'.

Figure 4A:
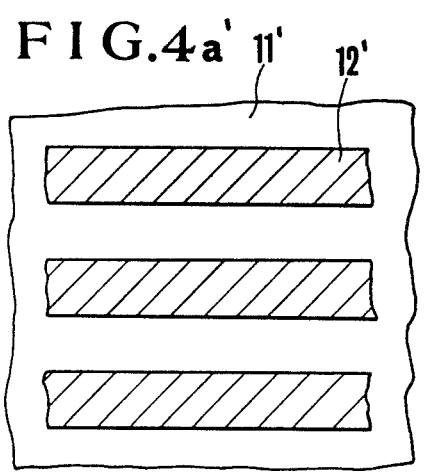

FIGS. 4a', 4b', 5a', 5c', 6a' and 6b' respectively show the detail of the disposition of the photoelectric transducing unit according to the enlarged section. FIG. 4a' shows the front view of the first photoelectric transducer 1', while FIG. 4b' shows the side view thereof. On the permeable support plate 11', for example, a bifilar-spiral photosensitive layer zone 12' is brought. This photosensitive layer zone 12' presents a photosensitive layer 7' for example, spiral as a whole. After having passed through the permeable support plate 11' the light beam 6' reaches the photosensitive layer zone 12' from the inside of the support plate 11'. The light beam coming out of the back side of this first photoelectric transducer is differently attenuated according to whether the light beam has passed only through the permeable support plate 11' (light beam 13') or further passed through the photosensitive layer zone 12' consisting of permeable, (for example light yellow) CdS (light beam 14'). (Hereby in case of the above mentioned second embodiment it is not always necessary that the above mentioned photosensitive layer zone 12' should be permeable).

Figure 5A:
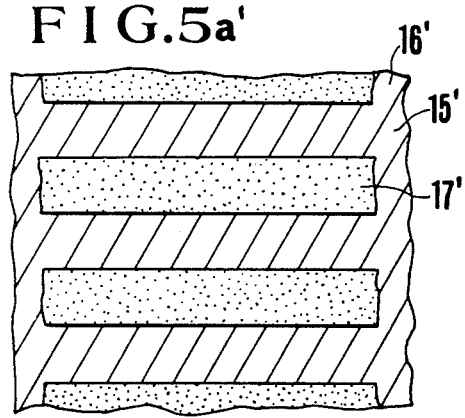
FIG. 5a shows the plane view of the second photoelectrical transducer 3' shown in FIG. 2b' and FIG. 5b' shows the sectional view while FIG. 5c' shows the plane view of the second photoelectrical transducer 3' shown in FIG. 2d' and FIG. 5d' shows the sectional view.
Figure 5B:
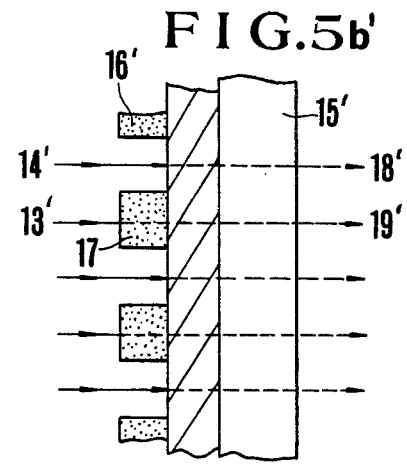

FIG. 5a' shows the front view of the second photoelectric transducer 3' (shown in FIG. 2b') of the above mentioned first embodiment while FIG. 5b' shows the side section thereof. On the permeable support plate 15' hereby for example at first the photosensitive layer 16' is formed for example all over the surface. On this layer 16' a parallel type conductor 17' presenting a permeability by means of for example, metalization process is immediately formed. This conductor 17' as a whole forms a pair of bifilar-spiral electrode pieces 8' and 9' in FIGS. 2b' and 3b'.

The sequence of the disposition of the photosensitive layer 16' and the conductor as well as the first and the second photoelectric transducer can be changed.

The intensity of the light beam coming out of the back side of the plate 15' after having passed through the photosensitive layer 16' is weak as compared with that of the light beam 14' due to the permeability of the light beam of the photosensitive layer 16' and the plate 15'.

Likely the intensity of the light beam 19' coming out of the back side of the plate after having passed through the conductor 17' and the photosensitive layer 16' is weak as compared with that of the light beam 13' due to the permeability of the light beam of the conductor 17' and the photosensitive layer 16'.

Figure 4B:
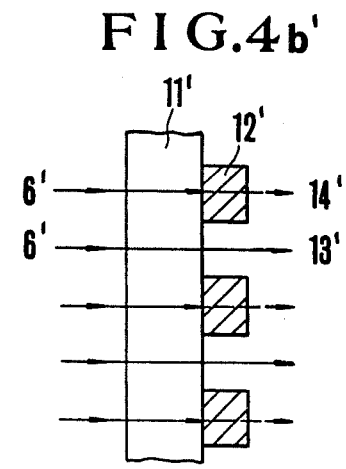

FIG. 6' shows in section the combination of FIGS. 4b' and 5b' presenting a thin insulation layer 2' serving as between-layer, namely the first embodiment of the photoelectric transducing unit according to the present invention as a whole. In order that hereby no undesirable influence could not be given to the photoelectric transducing unit (21') located optically backwards in case of the combination according to the present invention in which for example, as is particularly shown in FIG. 13' two photoelectric transducing units (20', 21') are utilized in series, it is necessary that the light beams 18' and 19' coming out of the photoelectric transducing unit 20' located optically at least forwards are always equal to each other in their intensity when a light beam 6' even in the intensity reaches the front surface of the unit 20'.

Hereby let the permeability of the light beam of each element composing the above mentioned unit be "q" (The index of "q" indicates the number of the element of the above mentioned unit), so the intensities $I_{18}$ and $I_{19}$ of the above mentioned light beams 18' and 19' are as follows:

$$I_{18} = I_6 \cdot q_{11} \cdot q_{12} \cdot q_2 \cdot q_{16} \cdot q_{15}$$

$$I_{19} = I_6 \cdot q_{11} \cdot q_2 \cdot q_{17} \cdot q_{16} \cdot q_{15}$$

whereby $I_6$ is the intensity of the light beam 6'.

Hereby in order that $I_{18}$ is equal to $I_{19}$, $q_{17}$ should be equal to $q_{12}$.

In consequence in case of the unit located optically forwards it is necessary to select the permeability of the light beam of the conductor 17' so as to correspond with that of the insulation layer 2' so that the light beams 18' and 19' are finally equal to each other.

Figure 5C:
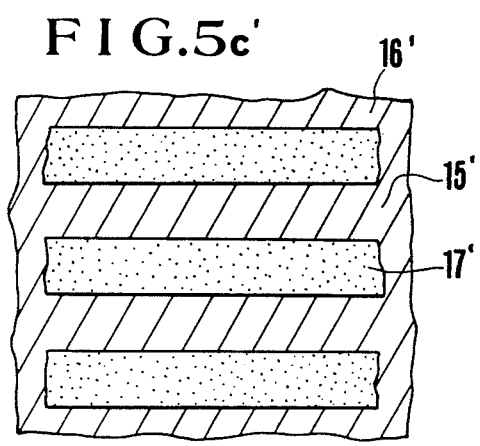
Figure 5D:
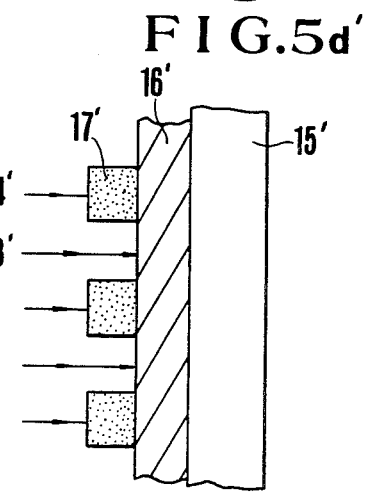

FIG. 5c' shows the front view of the second photoelectric transducer (shown in FIG. 2d') of the above mentioned second embodiment while FIG. 5d' shows the side view thereof. The second photoelectric transducer 3' of the present embodiment is composed similarly to that of the above mentioned first embodiment, so that the explanation is omitted.

Figure 6B:
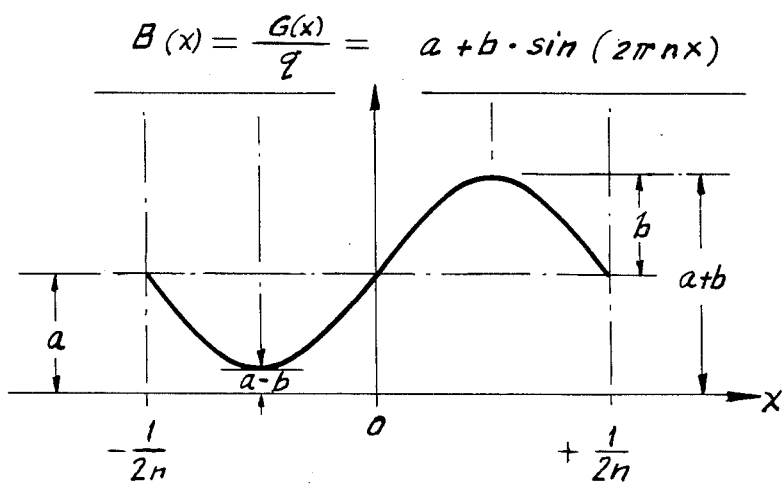
Figure 6A:
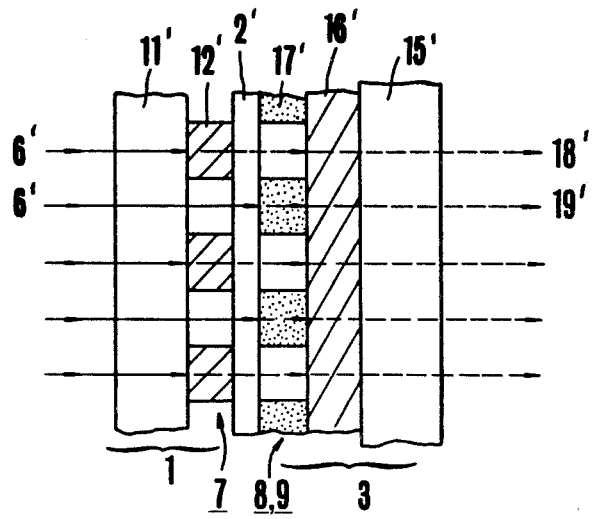
Figure 6B:
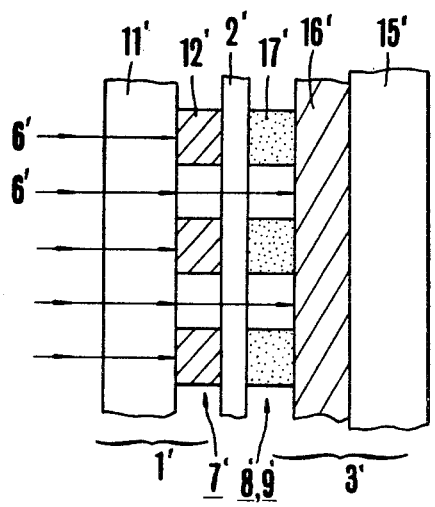

FIG. 6b' shows in section, similarly to the case of FIG. 6a', the combination of FIG. 4b' and FIG. 5d' presenting the insulation layer 2' serving as betweenlayer, namely the second embodiment of the photoelectric transducing unit according to the present form as a whole. As is clear from FIG. 6b' in case of the unit of the present embodiment the photosensitive layer zone 12' of the first photoelectric transducer 1' never overlaps the effective photosensitive zone of the photosensitive layer 16' of the second photoelectric transducing unit 3', namely the spatial zone formed by the conductor 17' (namely the electrode pieces 8' and 9') so that it is not alway necessary that the photosensitive layers 7', 16' as well as the electrode pieces 8', 9' should be permeable.

Several embodiments of the optical instruments according to the present invention in which such photoelectric transducing units as composed above will be explained below.

FIGS. 7' and 8' show the fundamental disposition of the important part of the optical instrument for detecting the focussing by detecting the clearness of the image formed by the optical instrument by means of one of the above mentioned photoelectric transducing unit and an embodiment of the electric circuit thereof. In FIG. 7', 23' is the image forming optics for forming the image of an object not shown in the drawing. The photoelectric transducing unit 20' as a whole is disposed on the optical path of the optics 23' and in its focus plane so as to serve to detect the sharpness of the image formed by means of the optics 23'. 31' is the electrical circuit for processing the electrical signals coming from the first and the second photoelectric transducers 1', 3' in the unit 20' while 32' is an indicator such as meter for indicating the state of focussing of the optics 23' by means of the output of the above mentioned electrical circuit 31'.

Figure 8:
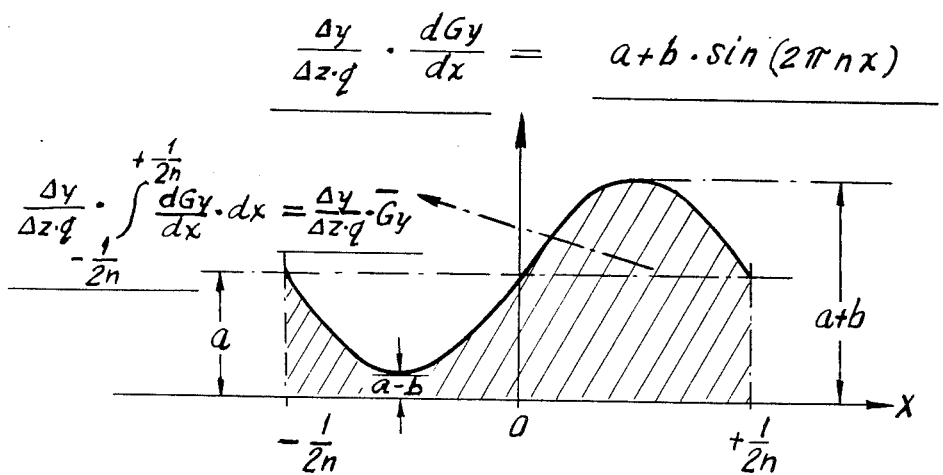
FIG. 8 is a graph illustrating the dependence of electrical conductance of the elementary or incremental regions in the Y direction on the site X.
Figure 7:
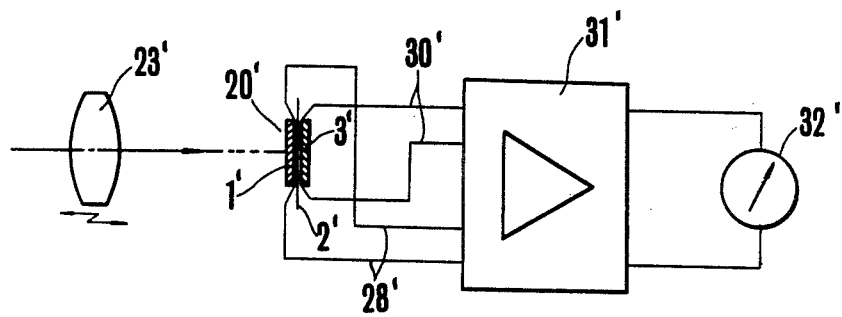
Figure 8:
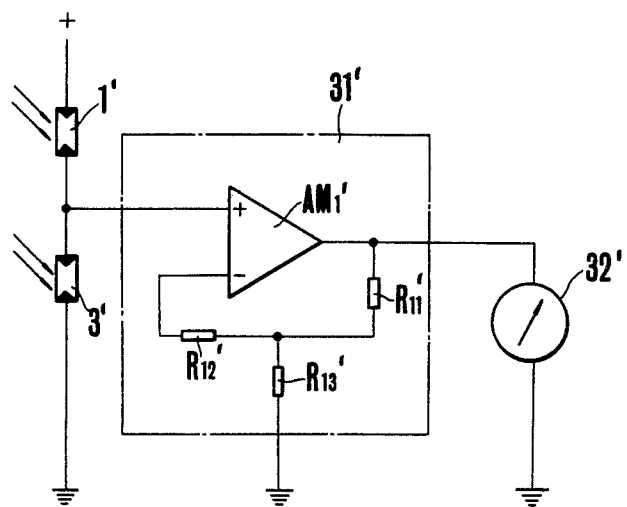

As is shown in FIG. 8', the first and the second photoelectric transducer 1', 3' in the unit 20' are connected in parallel with each other whereby to their connecting point (voltage deviding point) the above mentioned signal processing circuit 31' is connected. The present circuit 31' fundamentally consists of the processing amplifier $AM_1'$ receiving the output signals from the above mentioned photoelectric transducers 1', 3' at its non inversion input side and resistances $R_{11}'$, $R_{12}'$ and $R_{13}'$ connected in the negative feed back circuit from the output side to the inversion input side of the above mentioned processing amplifier $AM_1'$ for setting a desirable amplification factor of the processing amplifier $AM_1'$, whereby the above mentioned indicator 32' is connected to the output terminal of the circuit 31'.

The first and the second photoelectric transducer 1', 3' of the unit 20' disposed so as to correspond with the focus plane of the above mentioned optics 23' react to the sharpness, in other words the degree of the contrast of the image formed by the above mentioned optics 23' and search the limit value of the resistance value in accordance with the maximum contrast of the then image when the optics 23' is in the optimal state of the focus adjustment. Namely, the first photoelectrical transducer (series type photoelectric transducer) 1' presenting a photosensitive layer 7' disposed electrically in series searches the maximum value of its resistance value for the maximum contrast of the image. On the other hand, the second photoelectric transducer (parallel type photoelectric transducer) 3' presenting the photosensitive layer 16' disposed electrically in parallel searches the minimum value of its resistance value for the maximum contrast of the image when $\gamma$ is larger than 1 ($\gamma > 1$) in the following relation of the resistance value R and the luminance B $$R = \frac{A}{B^\gamma} \; (\Omega)$$

A: an optional constant
$\gamma$: a constant proper to the photoelectric semiconductive material forming the photosensitive layer In consequence the voltage devided by the voltage devider consisting of the series type photoelectric transducer 1' and of the parallel type photoelectric transducer 3' with $\gamma$ larger than 1, connected in series with the series type photoelectric transducer 1' as is shown in FIG. 8' assumes the minimum value.

In order that hereby the voltage deviding ratio $U_3/U_{(1+3)}$ of the voltage deviders (1', 3') could not be influenced by the mean luminance B' for a wide range, it is necessary that the indices $\gamma_1$ and $\gamma_3$ are equal to each other and preferably larger than 1' in the relation of the resistance value and the luminance $$R_1 = \frac{A_1}{B^{\gamma_1}} \; (\Omega), \quad R_3 = \frac{A_3}{B^{\gamma_3}} \; (\Omega)$$

whereby $A_1$ and $A_3$ are optional constants. Namely, $$\gamma_1 = \gamma_3 > 1$$

Hereby it is possible to realize $\gamma_1 = \gamma_3$ by forming both of the photosensitive layers 7' and 16' at the same time by means of for example vaporization process.

Thus $$\frac{U_3}{U_{(1+3)}} = \frac{R_3}{R_1 + R_3} = \frac{A_3}{A_1 \cdot B^{(\gamma_3 - \gamma_1)} + A_3} =$$

$$\frac{A_3}{A_1 + A_3} \neq F(B)$$

$$(\because \gamma_1 = \gamma_3)$$

In short, the voltage deviding ratio of the voltage devider (1', 3') is not influenced by the mean luminance B' in case $\gamma_1 = \gamma_3$ in the photoelectric transducer 1', 3'. In consequence even if the sharpness, namely the contrast of the image is in a low state the voltage variation taking place at the voltage deviding point, namely the connecting point of the photoelectric transducer 1', 3' forms a signal voltage at the input side of the signal processing circuit 31' whose output voltage is led to the indicator 32'.

In this way by means of the optical instrument shown in FIGS. 7' and 8', it is possible to detect the sharpness of the image formed by the optics 23' with high accuracy as well as to detect the focussing of the optics 23' with exactness.

Hereby it is easily possible to replace the above mentioned indicator 32' with an electrical driving means such as motor which receives the output of the above mentioned processing circuit 31' so as to drive the above mentioned optics 23' along its optical axis in such a manner that an automatic focus adjusting equipment can easily been realized according to the present invention.

Below an embodiment of the photographic camera capable of automatic focus adjustment of the photographing optics in which camera the automatic focus adjustment equipment according to the present information, adopting the fundamental disposition of the optical instrument shown in FIG. 7' is provided will be explained.

Figure 9:
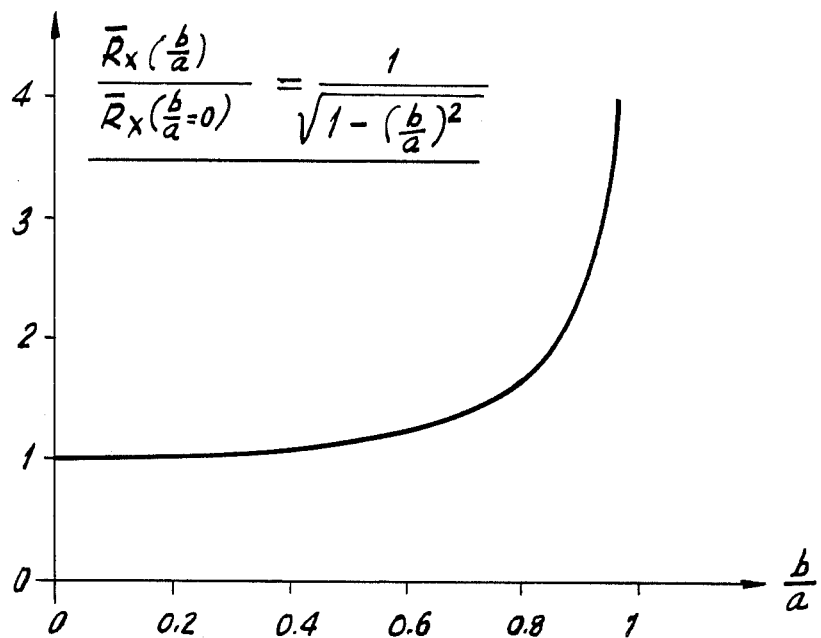
FIG. 9 is a graph illustrating the dependence of the mean resistance per period measured in the X direction on the ratio of the variation amplitude b to the mean value a of the illumination.
Figure 10:
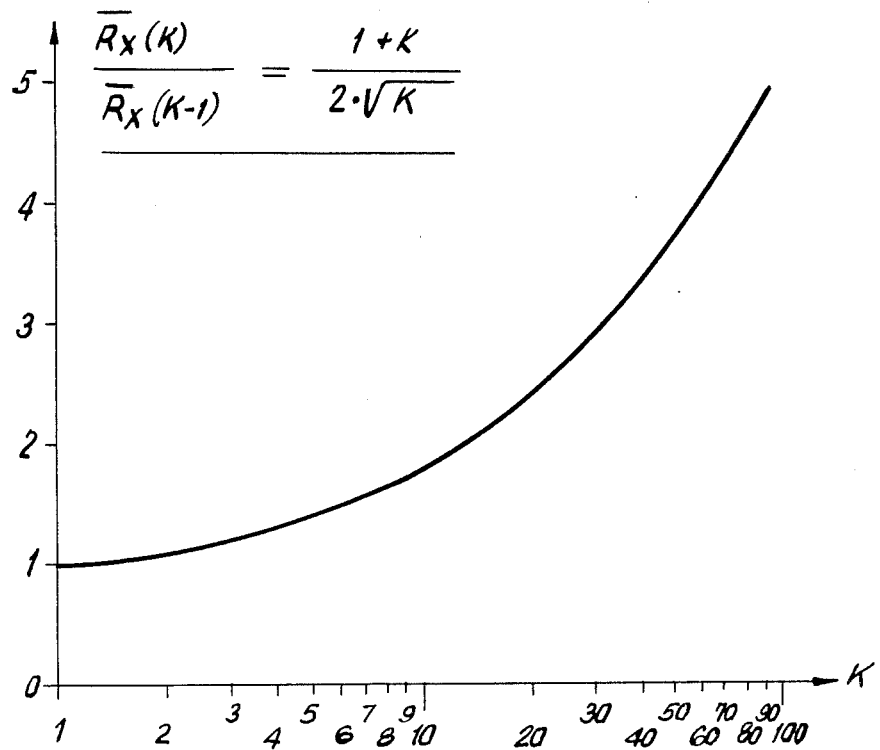
FIG. 10 is a graph illustrating the dependence of the relative mean resistance per period on the fine contrast.

FIG. 9' shows the disposition of the important part of the camera designed so as to be capable of automatic focus adjustment of the photographing optics according to the present invention, while FIG. 10' shows the electrical circuit and FIG. 11' shows the wave forms of signals at the important positions of the signal processing circuit.

In FIG. 9', the camera capable of automatic focus adjustment is indicated with $C_1'$ as a whole. $L_1'$ is a photographing lens system, which is held so as to be moved along its optical axis by means of a lens barrel 33' presenting a rack 33a' on a part. In the rack 33a', a pinion gear 36' secured on the rotary shaft 35' of the motor 34' is engaged. In consequence the lens barrel 33' is advanced forwards in the camera (to the left in the drawing) while holding the lens system $L_1'$ in accordance with the rotation of the motor 34' along the direction of the arrow in FIG. 9'. 37' is a spring provided between the camera body and the lens barrel 33', by means of which spring the lens system $L_1'$ is normally set at the most withdrawn position (a certain determined stopping position to the right in the drawing) when the motor 34' is out of operation. 38' is a conventional reflecting mirror, 39' the opening and closing member of the shutter, F' the film, 40' the focus plate, 41' the light beam splitter. The light beam 6' coming from an object not shown in the drawing passes through the lens system $L_1'$, is reflected by the movable reflecting mirror 38', further passes through the focus plate 40' and then is devided into the reflected light beam and the passed light beam by means of a semireflecting plane 41a' of the light beam splitter 41'. The then passed light beam is reflected by the pentagonal prism 43' and reaches the eye piece 44'. On the other hand, the light beam reflected by the semireflecting plane 41a' of the light beam splitter 41' passes through the lens 42' and enters into the photoelectric unit 20'.

Hereby 42' is the image reforming lens for forming again the image of the image formed on the focus plane 40', of an object by means of the photographing lens system $L_1'$, whereby the photoelectric transducing unit 20' is provided on the focus position of the above mentioned lens 42'. 31'' is the control circuit which processes the output of the above mentioned unit so as to control the motor 34', whereby its details are shown in FIG. 10'.

45' shows the photographing diaphragm, 46' the shutter release button of the camera symbolically according to the efficiency.

In the electrical circuit shown in FIG. 10', 47' is the detecting circuit for detecting the sharpness of the image formed by the above mentioned lens system $L_1'$, of an object, fundamentally consisting of the current source $E_1'$, the processing amplifier $AM_2'$, the series type photoelectric transducer 1' and the series type photoelectric transducer 3'. The disposition of the above mentioned circuit 47' is characterized in that the series type photoelectric transducer 1' is connected to the feed back circuit of the processing amplifier $AM_2'$ while the parallel type photoelectric transducer 3' is connected to the inversion input circuit of the processing amplifier $AM_2'$. In consequence, the amplification factor of the above mentioned detecting circuit 47' is proportional to $R_1'/R_3'$ ($R_1'$ and $R_3'$ being the resistance values of the transducers 1' and 3' respectively) as is usually known, so that the output of the above mentioned detecting circuit 47' assumes the minimum value when the sharpness of the image is maximum as is already explained. FIG. 11', (a) shows the then situation. 48' is a conventional amplifying circuit for amplifying the output of the detecting circuit 47', and amplifies the output of the above mentioned detecting circuit 47' sufficiently as is shown in (b) in FIG. 11' in such a manner that the output could be easily processed later. 49' is a conventional differentiating circuit for differentiating the output of the amplifying circuit 48', whereby the polarity of the output of said differentiating circuit 49' is inversed instantly as is shown in (c) in FIG. 11', when the output of the circuit 47', namely the sharpness of the image is maximum.

50' is a conventional comparing circuit for comparing the output of the differentiating circuit 49' with a certain predetermined standard voltage, giving out a certain predetermined level of output when the output of the circuit 49' transpasses the standard voltage. In consequence, it can easily be understood that at the time point at which the sharpness of the image is maximum the above mentioned predetermined level of output is given out as is shown in (d) in FIG. 11' in case the standard voltage is set at the 0' level.

51' is the braking circuit for quickly braking the motor 34' by means of the output of the comparing circuit 50', presenting the transistor $Tr_1'$, the thyristor SCR and the resistances $R_4'$, $R_5'$, $R_6'$ and $R_7'$. $S_1'$ is the starting switch for starting the motor, being in functional engagement of the above mentioned release button 46'.

Below the operation of the present camera will be explained. When at first the two step release button 46' is pushed down to the first step the switch $S_1'$ is closed in such a manner that the motor 34' is started. When the motor 34' is started, the photographing lens system $L_1'$ set to the most withdrawn position by means of the operation of the spring 37' is advanced forward against the force of the spring 37'. According as the lens system $L_1'$ is advanced, the sharpness of the image formed on the photoelectric transducing unit 20' is gradually changed. When then the sharpness of the image on the above mentioned unit 20' is maximum, as mentioned above the comparing circuit 50' gives out an output as shown in (d) in FIG. 11', which output is led into the base of the transistor $Tr_1'$ through the resistances $R_4'$ and $R_5'$ in the braking circuit 51'. In this way, in the braking circuit 51' the transistor $Tr_1'$ so far in the conductive state is brought into the cut-off state so that the thyrister SCR so far in the cut-off state is brought into the conductive state in such a manner that both terminals of the motor 34' are short-circuited and the motor 34' is braked quickly so as to keep the lens system $L_1'$ at the stopping position. In this state, the image of an object to be photographed by means of the lens system $L_1'$ becomes most clear on the film F'. When the release button 46' is further pushed down to the second step in this state, the movable semireflecting mirror 38' springs up while the shutter operating member 39' operates so as to give exposure to the film F'.

When the pushed down release button 46' is released after finishing the photographing, the switch $S_1'$ is opened in such a manner that the motor 34' becomes free so that the lens system $L_1'$ is returned to the predetermined withdrawn position due to the operation of the spring 37'.

In this way, the focus adjustment of the photographing optics in the present embodiment of the photographic camera can be carried out completely automatically.

So far the embodiment of the optical instrument with only one photoelectric transducing unit 20' has been explained, while the optical instrument with two photoelectric transducing unit will be explained below.

FIGS. 12' and 13' show two embodiments of the disposition of especially photoelectric transducing unit 20' in the optical instrument which is capable of detecting the focussing of the optics or automatical focus adjusting by means of two photoelectric transducing units.

FIG. 12' shows the disposition of the two photoelectric transducing units 20' and 21' combined with each other by means of the semipermeable mirror 22' and being suited for the automatic focus adjustment of the objective lens 23', whereby as is shown in the drawing the photoelectric transducing unit 20' is disposed by a distance l apart from the semipermeable mirror 22' while the photoelectric transducing unit 21' is disposed by a distant l + δ apart from the semipermeable mirror 22'. Hereby the objective lens 23' is disposed to the both units 20' and 21' is such a manner that the focus plane is set by a distance l + δ/2 apart from the semipermeable mirror 23'. In other words, the both units 20' and 21' are disposed by a distant δ/2 before respectively behind the focus plane of the objective lens 23'.

In consequence, in the state in which an object not shown in the drawing is focussed by the objective lens 23' the distance of the image of the object from the mirror 22' to the both units 20' and 21' is as follows:

$$b = l + \delta/2$$

Namely, the contrast of the details of the images on the units 20' and 21' is neither maximum nor minimum. The images on the units 20' and 21' are not sharp.

Figure 16:
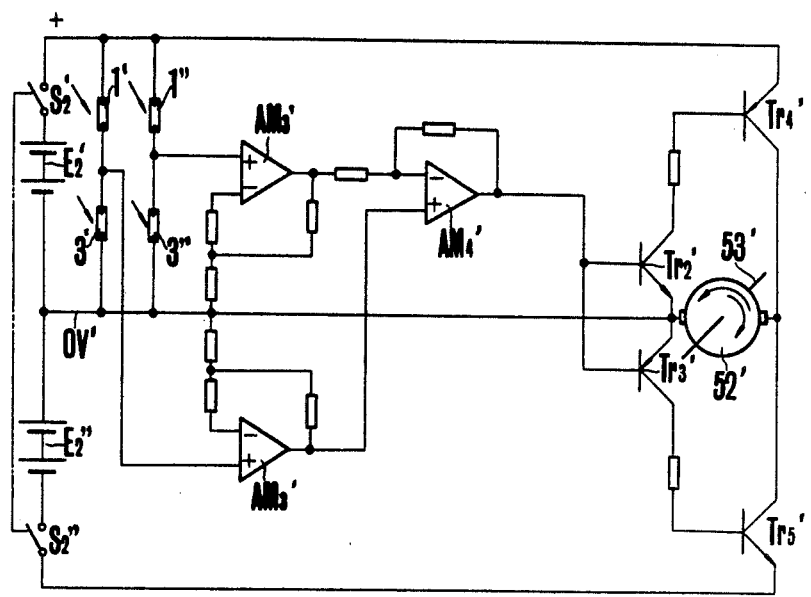
FIG. 16' shows the electrical circuit of the fundamental disposition of the control circuit 31'" of the photographic camera $C_2'$ shown in FIG. 14' as well as of the motion picture camera shown in FIG. 15'.

Hereby as electrical circuit for processing the output signals of the both units 20' and 21' in the fundamental equipment shown in FIG. 12' for example, such an electrical circuit as is shown in FIG. 16' is suited, whereby in the above mentioned state the above mentioned electrical circuit does not produce an amending signal because the output of the unit 20' is equal to that of the unit 21'.

On the other hand, when the object approaches the objective lens 23' the then distance b' of the image of the object, from the mirror is greater than b, namely $$b' > l + \delta/2$$

so that a "sharp" image is formed on the comparing unit 21' while a "less sharp" image is formed on the unit 20'.

Further, when to the contrary, the object leaves the objective lens 23' the then distance b" of the image of the object, from the mirror is smaller than b, namely $$b'' > l + \delta/2$$

so that a "less sharp" image is formed on the comparison unit 21' while a "sharp" image is formed on the unit 20'. In such a case, the electrical circuit as is shown in FIG. 16', for processing the output signals of the both units 20' and 21' produces an amending signal which is not 0' and serves to focus the objective lens 23' toward the above mentioned object. In this way, the motor 52' such as shown in FIG. 16' for adjusting the objective lens 23' is started.

The disposition shown in FIG. 12' already presents a substantially simplified arrangement as compared with the conventional one, by adopting two photoelectric transducing units according to the present invention, whereby a semipermeable mirror 22' serving as spectroscope is needed. However, in case as is shown in FIG. 13' by adopting the photoelectric transducing unit shown in FIG. 6a' as the unit 20' located optically forward two photoelectric transducing units 20' and 21' are joined with each other by means of a permeable separating plate 24', it is possible to eliminate the mirror 22' also. In this case, the separating plate 24' substantially determinates the length δ of the optical path necessary for the comparison, between the both units 20' and 21'.

The light beam absorbing layer 25' serves to shut the total light beam without reflection. Due to the total permeability q20' of the light beam of the first unit 20', the intensity of the light beam reaching the unit 21' is smaller, and therefore, the resistance values of both photoelectric transducer 1', 3' disposed in the unit 21' are higher than those in the unit 20', when their photosensitive layers present the same thickness so that the thickness $d_{21}$ of the photosensitive layer in the unit 21' is to be designed so as to fulfill the following relation relative to the thickness $d_{20}$ of the photosensitive layer in the unit 20'

$$d_{21} \approx d_{20}/q_{20}$$

In consequence, when the image of the object is not formed in the both units 20' and 21' combined optically forwards respectively backwards, the mutually corresponding photoelectric transducers 1' and 3' in the above mentioned unit 20' and 21' always present almost same resistance value. By means of this method, the 0' point can be best stabilized in the comparing disposition over a wide range of luminance.

In case of the fundamental disposition of the equipments shown in FIGS. 12' and 13', different from the case shown in FIG. 7', it is possible to detect the direction of the focus of the objective lens 23', namely whether the focus is forwards or backwards can also be detected.

Below an embodiment of the photographic camera or the motion picture camera capable of automatic focus adjustment of the photographing optics in which camera the automatic focus adjusting equipment according to the present invention adopting the fundamental disposition of the optical instrument shown in FIG. 12' is provided will be explained.

Figure 15:
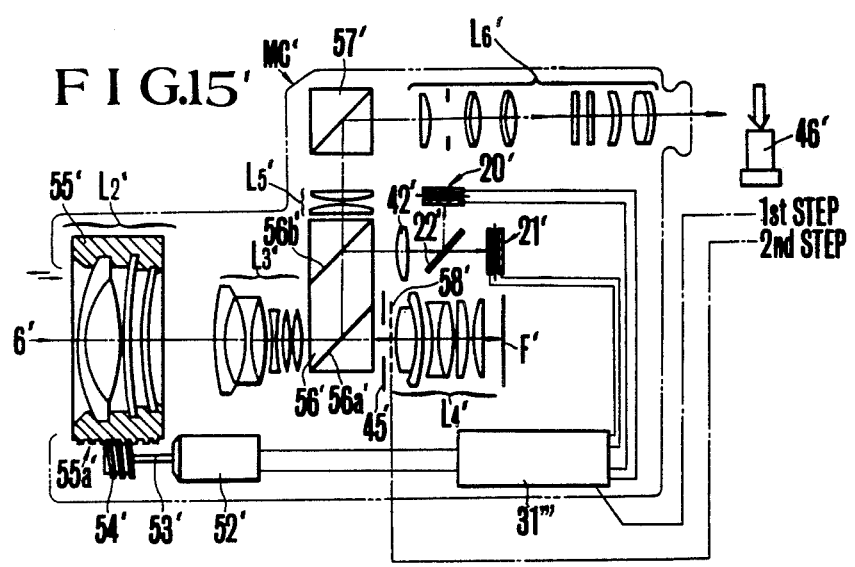
FIG. 15' shows the important disposition of an embodiment of the motion picture camera capable of the automatic focussing in which the fundamental disposition of the optical instrument shown in FIG. 12'.

FIG. 14' shows the disposition of the important elements of the photographic camera capable of automatic focus adjustment according to the present invention, of the photographing optics, FIG. 15' shows the disposition of the important element of the motion picture camera according to the present invention and FIG. 16' shows the fundamental disposition of the electrical circuit for the automatic focus adjusting equipment of the camera.

At first, the case with the photographic camera will be explained. The elements presenting the same figures as those of the elements in FIG. 9', in the photographic camera $C_2'$ shown in FIG. 14' present the same disposition and the same functions as the embodiment of the camera shown in FIG. 9', so that the explanations for such elements will be omitted or simplified in the followings.

The two photoelectric transducing units 20' and 21' and the semipermeable mirror in FIG. 14' are disposed according to the same fundamental disposition as that shown in FIG. 12'. Namely, the both units 20' and 21' is disposed at a position by a distance l respectively l + δ apart from the mirror 22', while the image reforming lens 42' is, similarly to the case of the objective lens 22' shown in FIG. 12', is disposed in such a manner that its focus plane is situated at a position by a distance l + δ/2 apart from the mirror 22'.

31''' is the control circuit for controlling the reversible motor 52', precessing the signals produced in the above mentioned two units 20' and 21', whereby its details are shown in FIG. 16'. 53' is the rotary shaft of the motor 52', 54' the worm gear connected with the rotary shaft 53', which worm gear engages in the rack 33a' of the lens barrel 33' for holding the photographing lens system $L_1'$. In consequence, the lens barrel 33' advances respectively retires holding the lens system $L_1'$ in accordance with the forward respectively the backward rotation of the motor 52'.

The electrical circuit shown in FIG. 16' is substantially a combination of the two electrical circuits shown in FIG. 8', whereby each circuit presents the same function as that shown in FIG. 8'. In the drawing, $E_2'$ and $E'_2'$ are the current sources while $S_2'$ and $S'_2'$ are the switches which are closed at the same time when the release button 46' is pushed down to the first step. 1', 1'' and 3', 3'' respectively show the series type photoelectric transducers respectively the parallel type photoelectric transducers in the two photoelectric transducing unit 20' and 21', whereby for the easy explanation the series type photoelectric transducer and the parallel type photoelectric transducer in the unit 21' present the FIGS. 1'' and 3''. The parallel type photoelectric transducers 1' and 3' are connected to the one input side of the processing amplifier $AM_3'$ while the series type and the parallel type photoelectric transducer 1'' and 3'' are connected to the one input side of the processing amplifier $AM_3'$, as is shown in the drawing, whereby the output sides of the processing amplifiers $AM_3'$ and $AM_3'$, are connected to the both input sides of the differential amplifier $AM_4'$. $Tr_2'$ and $Tr_3'$ are the transistors whose bases receive the output of the above mentioned amplifier $AM_4'$ whereby $Tr_2'$ and $Tr_3'$ are disposed, as is shown in the drawing, toward the motor 52' in such a manner that the transistor $Tr_2'$ forms the first switching circuit for the motor 52' together with the transistor $Tr_4'$ while the transistor $Tr_3'$ forms the second switching circuit for the motor 52' together with the transistor $Tr_5'$.

Below the operation of the present camera $C_2'$ will be explained below. When the camera is directed toward a desired object to be photographed and the two step release button 46' is pushed down to the first step, the switches $S_2'$ and $S_2'$, are closed in such a manner that the circuit shown in FIG. 16' starts the operation.

Hereby let the lens system $L_1'$ be correctly focussed for an object to be photographed, not shown in the drawing, so the image of the object is formed at a position by about $\delta'/2$ behind the unit 20' while the image of the object is formed at a position by about $\delta'/2$ before the unit 21'. In consequence, the images on the units 20' and 21' are not sharp to the same extent in such a manner that in the circuit shown in FIG. 16' almost the same devided voltage value appear at the both voltage devidens (1', 3'; 1'', 3''). The output voltage of the differential amplifier $AM_4'$ in this case is almost 0' in such a manner that all the transistors $Tr_2'$ - $Tr_5'$ are brought in the cut off state so that the motor 52' does not start.

In case the distance from the camera $C_2'$ to the object to be photographed becomes smaller than that in the above mentioned case, the contrast of the image on the unit 20' lowers so that the output of the voltage devided in the voltage devider (1', 3') increases while the contrast of the image on the unit 21' increases so that the output of the voltage devided in the voltage devider (1'', 3'') lowers. As explained above, the outputs of the both units 20' and 21' are varied reversedly. Due to these different output of the devided voltage the amplifiers $AM_3'$ and $AM_3'$, produce different voltages at their output terminals, in such a manner that the amplifier $AM_4'$ produces a voltage substantially different from 0', for example, a positive voltage by means of which voltage the first switching circuit, namely the transistors $Tr_2'$ and $Tr_4'$ are brought in the switched on state so that the motor 52' starts to rotate according to such a direction in which the photographing lens system $L_1'$ is best focussed for the object to be photographed, namely in such a direction in which the lens system $L_1'$ is advanced forwards in this case. While, the lens system $L_1'$ is advanced forwards according as the motor 52' rotates, the sharpness of the images on the unit 20' and 21' changes according to the elapse of time. When finally the lens system $L_1'$ reaches the position at which the best focus adjustment is obtained for the object to be photographed, the transistors $Tr_2'$ and $Tr_4'$ are brought in the cut off state as explained so that the motor 52' stopps at the then position in such a manner that the lens system $L_1'$ is held at the position at which the best focus adjustment is obtained for the object to be photographed. In this state, the image formed by the lens system $L_1'$, of the object becomes most clear on the film $F'$. When in this state, the release button 46' is further pushed down to the second step, the movable mirror 38' retires out of the optical path of the lens system $L_1'$ while the shutter operating member 39' is operated so as to give an exposure to the film $F'$.

When on the other hand, the distance from the camera $C_2'$ to the object to be photographed becomes larger than that in the above mentioned case, contrary to the above mentioned case, the contrast of the image on the unit 20' increases so that the output of the voltage devided at the voltage devider (1', 3') decreases, while the contrast of the image on the unit 21' decreases so that the output of the voltage devided at the voltage devider (1", 3") increases. In consequence at the output terminals of the amplifier $AM_4'$ a negative voltage appears quite contrary to the above mentioned case by means of which voltage the second switching circuit, namely, the transistors $Tr_3'$ and $Tr_5'$ are brought in the switched on state in such a manner that the motor 52' starts, in this case contrary to the above mentioned case, to rotate in such a direction in which the lens system $L_1'$ is withdrawn backwards. When the lens system $L_1'$ is retired until the best focus adjustment is obtained for the object to be photgraphed, the motor 52' stops similarly to the above mentioned case so as to keep the lens system at the then position.

In this way, the whole electrical circuit capable of automatic focus adjustment of the photographic lens system for an object with low contrast as is usual with the case of for example, the portrait photography can easily be replaced with an integral circuit according to the present technical standard of electronics.

Hereby the switches $S_1'$ and $S_2'$ are opened in functional engagement with the returning movement of the release button 46'.

Below an embodiment of the motion picture camera will be explained.

FIG. 15' is a schematic diagram illustrating the automatic focussing device in accordance with the present invention incorporated in a motion picture camera. The elements presenting the same figures as those shown in FIGS. 9' and 14', of the motion picture camera MC' shown in FIG. 15' present the same dispositions and the same functions as those in the embodiment of a photographic camera shown in FIG. 9' and FIG. 14', so that their explanations will be omitted or simplified. Among the photolens groups $L_2'$, $L_3'$ and $L_4'$ the first and the second lens groups $L_2'$ and $L_3'$ are utilized in common as an objective lens for range detecting. Hereby the lens group $L_2'$ is kept by the lens barrel 55' presenting a rack 55a' and moved along its optical axis by means of the rotation of the motor 52'. Between the lens group $L_3'$ and the lens group $L_4'$ a light beam splitter 56' presenting two permeable mirrors 56a' and 56b' is disposed. The lens group $L_5'$, the reflecting prism 57' and the lens group $L_6'$ compose a view finder optical system. The semipermeable mirror 56a' is disposed stantly to the optical axis so that the light beam coming from the lens group $L_3'$ to the film may be split toward a view finder optical system. In the optical path toward the view finder optical system from the mirror 56a' is disposed another semi-permeable mirror 56b' so that the light beam may be further split into the image reforming lens 42'. 58' is the shutter in the conventional motion picture camera. As the electrical circuit 31" for processing the signals of the photoelectric transducing units 20' and 21', the electrical circuit shown in FIG. 16' is adopted similarly to the case with the photographic camera $C_2'$ shown in FIG. 14'.

The operation of the automatic focus adjustment equipment in the present embodiment of the motion picture camera MC' is same as that of the photographic camera $C_2'$ shown in FIG. 14' so that the explanation is omitted.

The above mentioned embodiments are all those of the so called passive automatic focus adjusting equipments, whereby it is requested that such passive automatic focus adjusting equipments should operate with sureness over a wide range of luminance several ten times as large. What is thought out at first as the way how to fulfill the above mentioned requirement is to automatically adjust the initial value of the intensity to be measured. Namely, the initial value is varied for example, by the offset voltage of the amplifier in the electrical circuit or by the noise voltage due to the difference in the disposition of the photoelectrical converter reacting to the contrast of the image. Hereby the signal voltage produced in the photoelectric converter reacting to the contrast of the image is necessarily small as the level for the intensity to be measured (due to the non-linear effect) so that an amplification with comparatively high factor is necessary. However, the amplification with such a high factor is of meaning only when a signal with sufficiently high S/N' ratio (ratio of signal to noise) is put in the amplifier, namely the above mentioned noise voltage is sufficiently small as compared with the signal voltage to be measured which is hereby thought as the effective signal.

Below several improved embodiments in which the weight is put on the problem as to how to stabilize the initial value of the intensity to be measured in case of the amplification of the signal to be measured will be explained.

Figure 18:
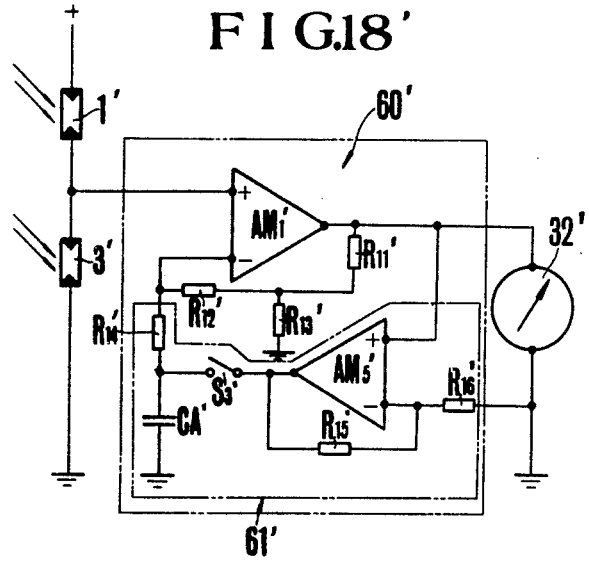
FIG. 18' shows the electrical circuit of the fundamental disposition of the signal processing circuit 60' in the optical instrument shown in FIG. 17'.
Figure 17A:
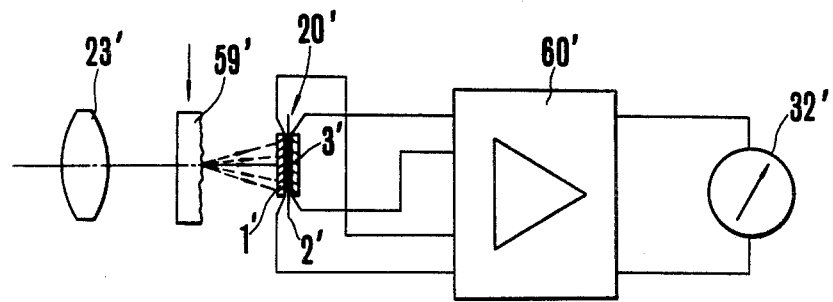
FIG. 17' shows in sketch the fundamental disposition of the equipment capable of automatically adjusting the initial value of the intensity to be measured in the optical instrument shown in FIG. 7'.
Figure 17B:
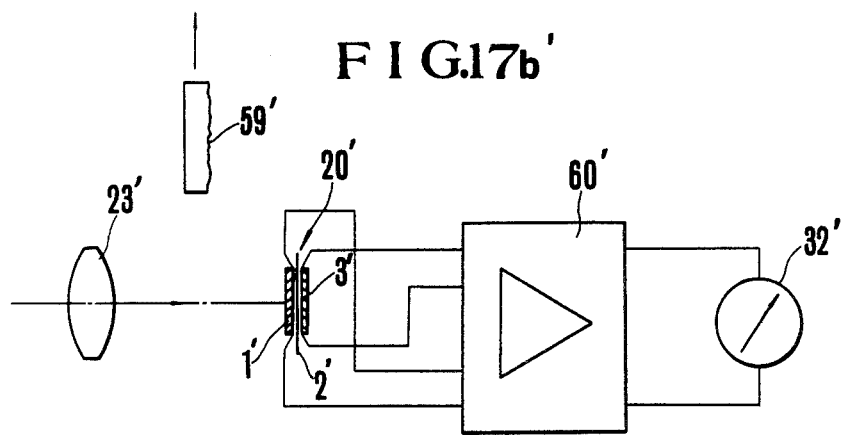

FIGS. 17a', 17b' and 18' show the fundamental disposition of the equipment in which the above mentioned difficulty is tried to be overcomed by selectively inserting a diffusion plate 59' into the optical path of the objective lens 23' and the electrical circuit thereof, whereby FIG. 17a' shows the state in which the diffusion plate 59' has been inserted into the optical path of the objective lens 22' while FIG. 17b' shows the state in which the diffusion plate 59' has been removed out of the optical path of the objective lens 23'. The disposition of this optical instrument is substantially equal to that of the equipment shown in FIG. 7'. 60' is the electrical circuit for processing the signal to be processed in the photoelectrical transducing unit, whereby its details are shown in FIG. 18'. The fundamental disposition of the electrical circuit shown in FIG. 18' is equal to that of the electrical circuit shown in FIG. 8', whereby in the negative feed back circuit from the output side to the inversion input side of the amplifier $AM_1'$ in the circuit shown in FIG. 8', a compensating circuit 61' for automatically stabilizing the initial value is connected. This compensating circuit 61' consists of the processing amplifier $AM_5'$ whose non-inversion input side receives the output signal of the amplifier $AM_1'$, the resistances $R_{15}'$ and $R_{16}'$ connected in the negative feed back circuit from the output side to the inversion input side of the above mentioned amplifier $AM_5'$ for setting the amplification factor in the above mentioned amplifier $AM_5'$, the switch $S_3'$ connected to the output terminal of the amplifier $AM_5'$, the capacitor $CA'$ connected with the switch $S_3'$ for storing the signal and the resistor $R_{14}'$, whereby when the switch $S_3'$ is closed during the operation, the output of the amplifier $AM_5'$ namely the compensating signal for stabilizing the initial value is stored in the capacitor $CA'$ and the compensating signal stored therein is put in the inversion input terminal side of the amplifier through the resistor $R_{14}'$.

When the switch $S_3'$ is closed the signal out, namely the output of the amplifier $AM_1'$ is lowered as low as nearly 0' due to the additional large negative fed back intensity substantially formed toward the signal amplifier $AM_1'$ through the amplifier $AM_5'$.

This very low initial value corresponds to the state of the very low contrast of the image, whereby when the switch $S_3'$ is closed the clearness of the images on the photoelectric transducers 1' and 3' is lowered remarkably by inserting the diffusion plate 59' (or another additional lens) into the optical path of the objective lens 23' as is shown in FIG. 17a' and the then mean luminance almost corresponds with that when the measurement is carried out while the diffusion plate 59' is put out of the optical path of the objective lens 23' as is shown in FIG. 17b'.

In this way, the automatic 0' point adjustment for the initial value of the intensity to be measured is realized for the correct mean brightness of the image, namely for the mean luminance.

FIG. 17a' shows the state of the automatic adjustment of the initial value before the measurement of the sharpness of the image, whereby the diffusion plate 59' is located in the optical path of the objective lens 23' while in the circuit shown in FIG. 18' the switch $S_3'$ is closed. FIG. 17b' shows the state of the actual measurement of the sharpness of the image, whereby the diffusion plate 59' is located out of the optical path of the objective lens 23', while in the circuit shown in FIG. 18' the switch $S_3'$ is opened and the amending signal stored in the capacitor $CA'$ is being delivered to the amplifier $AM_1'$. Hereby it is preferable that the operation of the switch $S_3'$ is functional engaged with the insertion and the removal of the diffusion plate 59'.

Figure 19A:
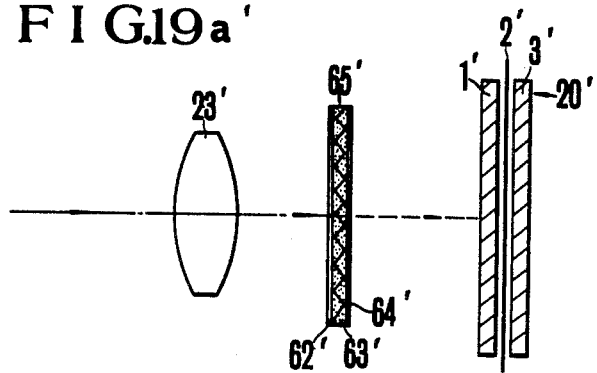
FIG. 19' shows in sketch an improvement of the optical instrument shown in FIG. 17', in which a liquid crystal cell 65' is applied in place of the diffusion plate 59' in the optical instrument shown in FIG. 17', whereby FIG. 19a' shows an embodiment in which the liquid crystal cell 65' is provided in the optical path between the objective lens 23' and the photoelectric transducing unit 20' while FIG. 19b' shows an embodiment in which the liquid crystal cell 65' is provided in the optical path before the objective lens 23'.
Figure 19B:
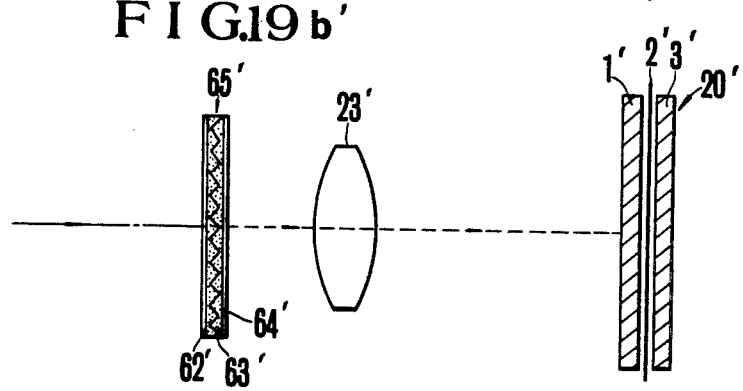

The above mentioned embodiment is improved in such a manner that the diffusion plate can be mechanically put into and out of the optical path of the objective lens while below a further improved embodiment will be explained whereby in place of the diffusion plate a cell presenting a liquid crystal (or liquid layer) is adopted. FIGS. 19a' and 19b' shows an embodiment in case the cell 65' containing liquid crystal 63' is disposed between the objective lens 23' and the photoelectric transducing unit 20' respectively another embodiment in case the cell 65' containing liquid crystal 63' is disposed before the objective lens 23', whereby as the measuring circuit for such equipment the electrical circuit shown in FIG. 18' is used in common with the embodiment in which the above mentioned diffusion plate 59' is used.

In the drawing, the cell 65' fundamentally consists of the liquid crystal 64' and the electrodes 62' and 63', whereby the "degree of dispersion" is varied within a limited state depending upon the control voltage put between the above mentioned electrodes 62' and 63'.

The liquid crystal cell 65' mounted in the optical instrument is electrically controlled in the following way.

(a) When a voltage is put between the electrodes 62' and 63' the cell 65' loses it permeability, which state corresponds to that in which the diffusion plate 59' in the above mentioned embodiment is mechanically put into the optical path, when by closing the switch $S_3'$ in the circuit shown in FIG. 18', an automatic level holding of the initial value can be realized similarly to the above mentioned embodiment. When further at this time, the absorption of the light beam is not large the level holding of the initial value is realized for the mean luminance similarly to the state of the automatic focus adjustment.

(b) When the voltage put is removed the cell 65' resumes its permeability for the automatic focus adjustment so that the shut out of the light beam against the photoelectric transducing unit 20' is released.

Hereby, the means for controlling the putting the voltage between the electrodes 62' and 63' can be realized in the form of for example, a conventional mechanical switch contact or a switching element electrically controlled (transistor, FET etc.), whereby it is preferable that the operation of this control means should be functionally engaged with the switch $S_3'$ in the circuit shown in FIG. 18'.

Figure 20:
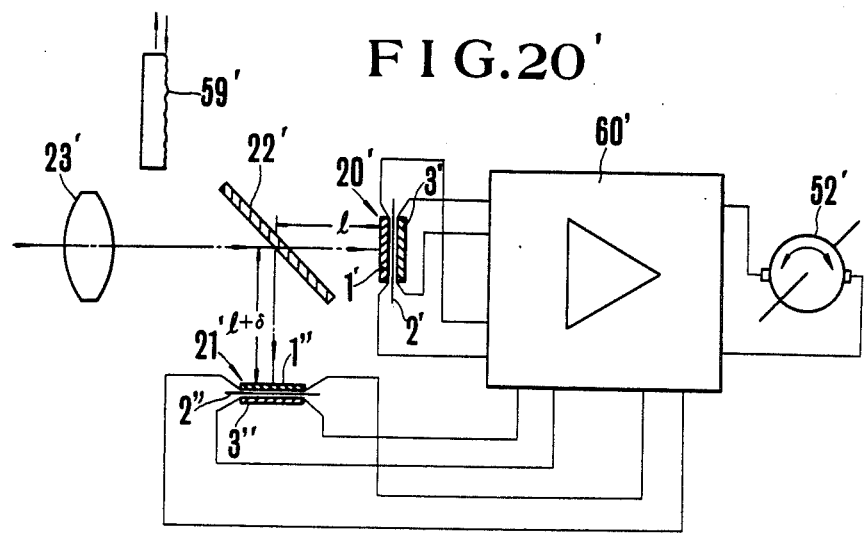
FIG. 20' shows in sketch the fundamental disposition of the equipment capable of automatically adjusting the initial value of the intensity to be measured basing upon the principle of the equipment shown in FIG. 17', in the optical instrument shown in FIG. 12'.

FIGS. 20' and 21' show a fundamental disposition of an embodiment in which the principle explained in detail according to the FIGS. 17a' and 17b' for enabling the automatic adjustment of the initial value of the intensity to be measured in the fundamental disposition of the optical instrument shown in FIG. 12', namely the system to put the diffusion plate 59' into and out of the optical path of the objective lens 23' is adopted and the electrical circuit suited for such embodiment. The elements presenting the same figures as those of the elements shown in FIGS. 12', 16', 17a', 17b' and 18', in FIG. 20' and FIG. 21' present the same disposition and the same function as those shown in the above mentioned drawings. 60''' in FIG. 20' is the electrical circuit for processing the signal to be measured of the photoelectrical transducing units 20' and 21' so as to control the motor 52' and for enabling the automatic adjustment of the initial value of the intensity to be measured, whereby its details are shown in FIG. 21'.

Figure 21:
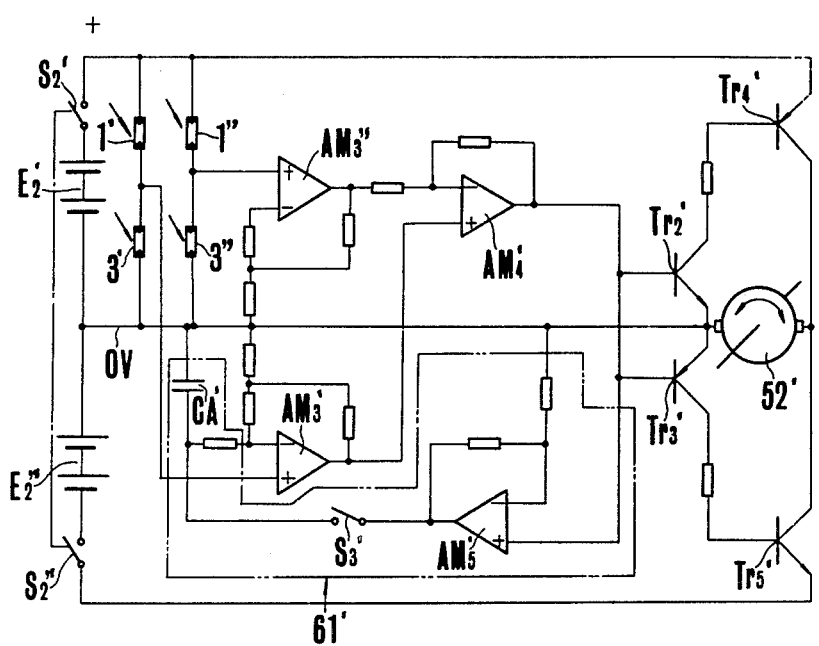
FIG. 21' shows the electrical circuit of the fundamental disposition of the signal processing circuit 60" in the optical instrument shown in FIG. 20'.

The electrical circuit shown in FIG. 21' presents fundamentally a similar disposition of the electrical circuit shown in FIG. 16', whereby in the negative feed back circuit from the output side of the amplifier $AM_4'$ to the inversion input sides of the amplifier $AM_3'$ and $AM_3'$, a compensation circuit shown with 61' as a whole in FIG. 18 is respectively connected.

The operation of the embodiment shown here is substantially equal to that of the above mentioned embodiment so that its detailed explanation will be omitted.

Further, it is essential that in case of a motion picture camera the diffusion plate 59' should be for example, the rotary wings passing through the optical path periodically whereby the switch $S_3'$ should synchronously be closed.

By means of the above mentioned improvement, a sure automatic focus adjustment can be realized even for the change of the photographing scene covering a very wide range of the mean luminance.

Hereby it goes without saying that the photoelectric semiconductor composing the photosensitive layers (7', 12', 6') of the photoelectric transducer 1', 3' and 1'', 3'' in the above mentioned photoelectric transducing units 20' and 21' can be not only photoresistors but also for example, photo-diodes or photo-transistors.

As explained above, in detail in case of the photoelectric transducing unit, by realizing a bifilar spiral disposition of the photosensitive layers or the electrodes of a series type photoelectric transducer and a parallel type photoelectric transducer composing the above mentioned unit, it has become possible that the photosensitive layers of the above mentioned photoelectric transducers could be formed in continuation without any interruption in the photosensitive zone of the above mentioned photoelectric transducing unit. This means the enlargement of the effective photosensitive zone, the elimination of the non photosensitive zone at the central part of the light beam receiving surface of the above mentioned unit and the simplification of the photosensitive layers and the electrodes in the above mentioned unit, in which the correlative disposition of the photosensitive layers of the series type photoelectric transducer and of the parallel type photoelectric transducer is especially important, whereby in the above mentioned way, the most ideal disposition of the photosensitive layers of this kind of the photoelectric transducing unit composed of a combination of the series type photoelectric transducer and of the parallel type photoelectric transducer can be realized. Namely, this kind of the photoelectric transducing unit is utilized as detecting element for detecting the sharpness of the image of an object formed by means of the image forming optical system of an optical instrument in the embodiments of the present invention, whereby the fact that thanks to the above mentioned disposition of the photosensitive layers or of the electrode there exists no non photosensitive zone especially at the central part of the light beam receiving surface of the above mentioned unit is very profitable when for example, the above mentioned optical instrument is a camera because at taking photograph it is usual that the central part of the object is focussed in such a manner that in case of the above mentioned unit, the central part of the light receiving surface is made to correspond with the central part of the above mentioned object to be photographed. Further, thanks to the above mentioned disposition of the photosensitive layers or of the electrodes, it is possible to form a photosensitive layer effective for such an object the pattern of whose dark and bright part is very complicated, without any complicated modification, whereby not only the electrodes connected to the photosensitive layer as well as the terminals connected to the electrodes of the series type photoelectric transducer but also the terminals connected to the electrodes of the parallel type photoelectric transducer can be located outside of the effective light beam receiving surface of the photoelectric transducer so that the photosensitive zone of the above mentioned unit is all the more enlarged which is very profitable.

Thus the object image sharpness detecting system according to the present invention, in which a photoelectric transducing unit presenting above mentioned features and advantages is able to detect the variation of the sharpness of the object image with very high accuracy.

Although in the attached drawings of the embodiments only rectangular spiral photosensitive layers or electrodes of the above mentioned photoelectric transducer are shown, the form can be for example circular. Various variations of the form according to design are easily possible.

While embodiments of the invention have been described in detail, it will be obvious to those skilled in the art that the invention may be embodied otherwise without departing from its spirit and scope.

I claim:

1. A photoelectric cell for converting variations in the sharpness of an object image, formed by an image forming optical system into variations in electrical signal, comprising:
   (a) a non-conducting base plate;
   (b) a photosensitive layer in the form of a strip having two long edges and two short edges shorter than the long edges and disposed on said base plate, said strip being wound in a bifilar-spiral shape on said base plate and forming light sensing means having an effective light sensing area defined by the bifilar spiral shape; and
   (c) a pair of electrodes electrically connected with said strip; said strip being wound in the bifilar spiral shape between said electrodes, and said sensing area being restricted by the shape of said strip, and
   said sensing means being responsive to the object image formed by the optical system for generating an electrical signal corresponding to the image sharpness and flowing from one of said electrodes to the other through said photosensitive layer substantially along the surface of said base plate; thereby variations in the sharpness of the object image formed by the optical system are converted into variations in the electrical signal.

2. A cell as in claim 1, wherein said electrodes are connected to the respective short edges of said strip.

3. A cell as in claim 2, wherein said strip has two end portions and said electrodes are connected to the respective end portions.

4. A cell as in claim 2, wherein said cell has a light response characteristic such that when the image sharpness has reached the maximum, a peak electrical signal appears.

5. A cell as in claim 1, wherein said electrodes are wound in a substantially identical spiral shape to that of said strip and connected to the respective long edges of the strip.

6. A cell as in claim 5, wherein said conversion cell has a light-response characteristic such that when the image sharpness has reached the maximum, a peak electrical signal appears.

7. A cell as in claim 1, wherein said sensitive layer is formed of a photosemiconductive material.

8. For an image forming optical system, adjustable to form an image of an object at a predetermined position, a focus detecting system, comprising:
   (a) first and second photoelectric conversion means in the path of light from the optical system and at least one of said conversion means being able to convert variations in the sharpness of the object image formed by the optical system into variations in electrical signal, each of said first and said second conversion means comprising:
     (1) photosensitive means having a portion in the form of a strip with two long edges and two short edges shorter than the long edges, said strip being wound in a bifilar-spiral shape and forming light sensing means having an effective light-sensing area defined by the bifilar-spiral shape; and
     (2) a pair of electrodes electrically connected with said strip; said strip being wound in the bifilar-spiral shape between said electrodes, and the sensing area being restricted by the shape of the strip, and
   (b) said sensing means being responsive to the object image formed by said optical system for generating an electrical signal corresponding to the image sharpness and flowing from one of said electrodes to the other through said portion of the photosensitive means; and (c) detecting circuit means coupled to the electrodes of said two conversion means for detecting the focusing condition of the optical system on the basis of the electrical signals provided by the two conversion means.

9. A system as in claim 8, wherein said electrodes of said first conversion means are connected to respective short edges of said strip.

10. A system as in claim 9, wherein the short edges of said strip of said first conversion means are disposed outside said sensing area and said electrodes are connected to the respective short edges of said strip in the outside of said sensing area.

11. A system as in claim 10, wherein said first conversion means exhibits a light response characteristic such that a peak electrical signal is produced when the image sharpness on said first conversion means has reached the maximum.

12. A system as in claim 9, wherein said electrodes of said second conversion means are wound in a substantially identical spiral shape to that of said strip of the second conversion means and connected to the respective long edges of said strip.

13. A system as in claim 12, wherein said second conversion means produce a peak electrical output when the sharpness of the image on said second conversion means has reached the maximum.

14. A system as in claim 8, wherein said electrodes of one of said two conversion means are wound in a substantially identical spiral shape to that of said strip and connected to the respective long edges of said strip.

15. A system as in claim 8, wherein said conversion means exhibit noise signals unrelated to image sharpness, said focus detecting system further comprising:

correcting means responsive to the brightness of the object and coupled to said circuit means for eliminating the noise signals of said conversion means unrelated to image sharpness by supplying the circuit means with an electrical signal corresponding to the object brightness.

16. A system as in claim 15, wherein said circuit means is settable to an operating state for eliminating the noise signals of said conversion means unrelated to image sharpness; wherein said correcting means includes adjusting circuit means for setting the operating state of said detecting circuit means, said adjusting circuit means being electrically coupled to said detecting circuit means and applying the electrical signal corresponding to the brightness of the object to said detecting circuit means for setting the operating state of said detecting circuit means to said state for eliminating the noise signal of the first and second conversion means unrelated to image sharpness.

17. A system as in claim 16, wherein said correcting means further includes:

optical means for applying a blurred image onto at least one of said first and said second conversion means, so that conversion means receiving the blurred image from said optical means produces an electrical output corresponding to the brightness of the object; said adjusting circuit means operating in response to the electrical output corresponding to the object brightness from said conversion means to adjust the operating state of said detecting circuit means.

18. A system as in claim 17, wherein said adjusting circuit means includes memory means for memorizing an electrical signal corresponding to the object brightness to which the operating mode of said detecting circuit means is to be adjusted, said memory means being electrically connected to said detecting circuit means, and said detecting circuit means being receptive of the electrical signal corresponding to the object brightness from said memory means so that its operating state is adjusted in accordance therewith.

19. A system for detecting the focusing condition of an image forming optical system, said optical system being adjustable for forming an object image at a predetermined position, said detecting system comprising:

(a) first and second photoelectric conversion cells each for converting variations in sharpness of the object image formed by said optical system into variations in electrical signals, said two conversion cells each having a photosensitive surface, said surfaces being disposed to the rear and front of and optically equidistant from said predetermined position, so that each of said conversion cells generates the electrical signal corresponding to the image sharpness on each of said photosensitive surfaces, each of said two conversion cells comprising:

(1) a non-conductive base plate;
(2) a photosensitive layer on said base plate in the form of a strip having two long edges and two short edges shorter than the long edges, said strip being wound in a bifilar-spiral shape on said plate and defining an effective sensing area within said photosensitive surfaces; and
(3) a pair of electrodes electrically connected with said strip, said strip being wound in the bifilar-spiral shape between said electrodes, (b) each of said sensing areas being responsive to the object image formed by said optical system for generating electrical signal corresponding to the image sharpness and flowing from one of said electrodes to the other through said layer substantially along the surface of said base plate; and (c) detecting means coupled to the electrodes of said cells for detecting the focusing condition of said optical system on the basis difference in the electrical signals of said two cells.

20. A system as in claim 19, wherein each of said two conversion cells has a light response characteristic such that, when the image sharpness has reached the maximum, a peak electrical signal appears.

21. A system as in claim 20, wherein said electrodes of said first conversion cell are connected to the respective short edges of said strip.

22. A system as in claim 21, wherein said first conversion cell has a light response characteristic such that as the image sharpness is improved, its electrical signal gradually decreases and reaches a minimum value when the maximum image sharpness is attained.

23. A system as in claim 20, wherein said electrodes of said second conversion cell are wound in a substantially identical spiral shape to that of said strip of said second cell and connected to the respective long edges of said strip.

24. A system as in claim 23, wherein said second conversion cell has a light response characteristic such that as the image sharpness is improved, its electric signal gradually increases and reaches a maximum value when the maximum image sharpness is attained.

25. For an optical system, adjustable to form an object image at a predetermined position, a system for detecting the focusing condition of the optical system, comprising:
  (a) first and second photo-electric conversion means for converting variations in the sharpness of the image formed by the optical system into variations in electrical signals, said conversion means being disposed substantially at the predetermined position so as to generate the electric signals corresponding to the image sharpness; said first conversion means being responsive to the object image formed by said optical system for producing an electrical signal corresponding to the image sharpness and comprising:
    (1) a first non-conductive base plate;
    (2) a first photosensitive element on said first base plate in the form of a strip having two short edges and two long edges longer than the short edges, said strip being wound in a bifilar-spiral shape; and
    (3) a first pair of electrodes, each electrically connected with the short edge of said first strip shaped photosensitive element;
  said electrical signal corresponding to the image sharpness flowing from one of said first pair of electrodes to the other through said first element substantially along the surface of said first plate; and said second conversion means being responsive to the object image formed by the optical system for producing an electrical signal corresponding to the image sharpness and comprising:
    (1) a second non-conductive base plate;
    (2) a second photosensitive element on said second base plate in the form of a strip having two short edges and two long edges longer than the short edges base plate, said strip being wound in a bifilarspiral shape on said second plate; and
    (3) a second pair of electrodes, each being electrically connected with the long edge of said second strip like sensitive element said second pair of electrodes being wound in a substantially identical spiral shape to that of said second element and being connected along the long edges of said second element; said electrical signal corresponding to the image sharpness flowing from one of said second pair of electrodes to the other through said second element substantially along the surface of said second plate; and
  (b) detecting circuit means electrically connected with said first and second pairs of electrodes of said first and second conversion means for detecting the focusing condition of said optical system on the basis of the electrical signals provided by, said first and second conversion means.

26. A system as in claim 25, wherein said first conversion means exhibits a light response characteristic such that as the image sharpness increases, the electric signal gradually decreases and reaches a minimum value when the maximum image sharpness is attained and said second conversion means exhibits a light response characteristic such that as the image sharpness increase, the electrical signal gradually increases and reaches a maximum value when the maximum image sharpness is attained.

27. A system as in claim 26, further comprising: correcting means coupled to said circuit means to supply an electrical signal thereto based on the brightness of the object for causing said circuit means to eliminate the noise signal of said first and second conversion means unrelated to image sharpness.

28. A system according to claim 27, wherein said detecting circuit means is settable to an operating state to eliminate the noise signals of said first and second photoelectric conversion means unrelated to image sharpness; wherein said correcting means includes an adjusting circuit means to set the operating state of said detecting circuit means, said adjusting circuit means being electrically coupled to said detecting circuit means and applying the electrical signal corresponding to the brightness of the object to said detecting circuit means so that the operating state of said detecting circuit means is set to said state to eliminate the noise signals of the first and second conversion means having no relationship with image sharpness.

29. A system as in claim 28, wherein said correcting means further includes;
  optical means selectively insertable into and removable from a light path from said optical system to said two conversion means, for applying a blurred image onto said first and said second conversion means; said two conversion means, when receiving the blurred image from said optical means, producing electrical signals corresponding to the brightness of the object; and said adjusting circuit means being responsive to an electrical output produced from said detecting circuit means when said two conversion means receive the blurred image and adjusting the operating state of said detecting circuit means on the basis of said electrical output of the detecting circuit means.

30. A system as in claim 29, wherein said adjusting circuit means includes memory means connected to said detecting circuit means for memorizing the electrical output of the detecting circuit means when said conversion means receive the blurred image, said detecting circuit means being adjustable in response to the memorized electrical signal memorized in said memory means.

31. A light-to-electrical signal conversion unit, comprising:
  (a) electrical insulation means permitting the passage of light therethrough and having a first area and a second area;
  (b) first photoelectric converting means including:
    (1) a first pair of electrodes in the form of strips, each strip having two long edges and two short edges shorter than the long edges, each of said electrodes being disposed over the first area of said insulation means so that the electrodes never cross each other, one of the short edges of each electrode being disposed substantially at the center of the first area, said electrodes being bifilarly wound relative to each other over the first area; and
    (2) a first photosensitive element disposed between said first electrodes; and
  (c) second photoelectric converting means including:
    (1) a second photosensitive element in a form of a strip having two long edges and two short edges shorter than the long edges, said long edges having central portions, said second photosensitive element being folded so that the central portions are situated substantially at the center of the second area of said insulation means and being wound bifilarly over the second area similarly to said first photosensitive element, the short edges of said second photosensitive element being situated at the outside of the second area; and (2) a second pair of electrodes, each of said second electrodes being connected to each of said short edges of said second photosensitive element.

32. A unit according to claim 31, wherein said second photosensitive element of said second photoelectric converting means overlies said first pair of electrodes of said first photoelectric converting means except at the center of the first area between short edges of said first pair of electrode members of said first photoelectric converting means.

33. A unit according to claim 32, wherein said first photoelectric converting means includes first holding means for holding said first photosensitive element while said second photoelectric converting means includes second holding means for holding the second photosensitive element; said first and said second holding means each having a surface opposing said insulation means; said and photosensitive elements in said first and second photoelectric converting means being respectively disposed on the surfaces opposed to said insulation means.

34. A unit according to claim 33, where in said second holding means permits the passage of light while said first holding means is formed so as to prevent said photosensitive elements of said first and said second photoelectric converting means from being influenced by light coming from a surface opposing the surface facing said insulation means.

35. A unit according to claim 31, wherein said second photosensitive element of said second photoelectric convering means permits the passage of light and overlies said first photosensitive element of said first photoelectric converting means.

36. A unit according to claim 35, wherein said first photoelectric converting means includes first holding means having a surface opposing said insulating means for holding said first photosensitive element and said second photoelectric converting means includes second holding means having a surface opposing said insualting means for holding the second photosensitive element; said photosensitive elements in said first and second photoelectric converting means being respectively disposed on the surfaces opposed to said insulation means.

37. A unit according to claim 36, wherein said second holding means permits the passage of light while said first holding means is formed to prevent said photosensitive elements of said first and second photoelectric converting means from being influenced by light coming from a surface opposing the surface facing said insulation means.

38. A unit according to claim 31, wherein said first and second photosensitive elements have non-linear electrical response characteristics with respect to the change in luminous intensity.

39. A unit according to claim 31, wherein said first and second photoelectric converting means have such electrical output characteristics that when the sharpness of an image to be formed thereon reaches maximum, their respective outputs reach peak values.

40. A unit according to claim 39, wherein said first and second photoelectric converting means have mutually different electrical output characteristics with respect to the change in the sharpness of the image.

41. A unit according to claim 40, wherein said first photoelectric converting means has a first electrical output characteristic such that its output increases with an increase in the sharpness of the image, and said second photoelectric converting means has a second electrical output characteristic such that its output decreases with an increase in the sharpness of the image.

42. For an optical system adjustable along an optical axis to form an image of an object at a predetermined position, a focus detecting system for detecting the focusing condition of the optical system, comprising:

a light-to-electrical signal converting unit disposed substantially at said predetermined position, said converting unit comprising: electrical insulating means permitting the passage of light therethrough and having a first area and a second area; and first and second photoelectric transducing means disposed at both sides of said insulation means; said first photoelectric transducing means including:

a first pair of electrodes in the form of strips, each strip having two long edges and two short edges shorter than the long edges, each of said electrodes being disposed over the first area of said insulation means so that the electrodes never cross each other, one of the short edges of each electrode being disposed substantially at the center of the first area, said electrodes being bifilarly wound relative to each other over the first area; and a first photosensitive element disposed at least in the space of bifilar part formed by said first electrodes; and said second photoelectric transducing means including:

a second photosensitive element in the form of a strip having two long edges and two short edges shorter than the long edges, said second photosensitive element being disposed over the second area of said insulation means, said long edges having central portions, said second photosensitive element being folded so that the central portions are situated substantially at the center of the second area and being wound bifilarly over the second area corresponding to said first photosensitive element, the short edges of said second photosensitive element being situated at the outside of the second area; and a second pair of electrodes connected respectively to said short edges of said second photosensitive element; and detecting means electrically connected to the first and second pairs of electrodes of said first and second photoelectric transducing means for detecting the focusing condition of the optical system by detecting the output of the light-to-electrical signal converting unit.

43. A system according to claim 42, wherein said second photosensitive element of said second photoelectric transducing means overlies said first pair of the electrodes of said first photoelectric transducing means except at the center of the first area between short edges of said first pair of the electrodes of said first photoelectric transducing means.

44. A system according to claim 43, wherein said first photoelectric transducing means includes first holding means for holding said first photosensitive element and having a surface facing said insulation means, said and second photoelectric transducing means including second holding means for holding said second photosensitive element and having a surface facing said insulation means; said photosensitive elements of said first and said second photoelectric transducing means being respectively disposed on the sufaces of said first and second holding means facing said insulation means.

45. A system according to claim 44, wherein said second holding means is formed to permit the passage of light while said first holding means is formed so as to prevent said photosensitive elements of said first and second photoelectric transducing means from being influenced by the light coming from a surface opposite the surface facing said insulation means.

46. A system according to claim 42, wherein said detecting means includes processing circuit means for comparing the output of said first photoelectric transducing means with that of said second photoelectric transducing means so as to produce an output in the form of an electrical comparison signal.

47. A system according to claim 46, in which said detecting means further includes compensating means coupled to said processing circuit means for compensating the output of said processing circuit means in accordance with the brightness of the object.

48. A system according to claim 47, wherein said compensating means includes operating circuit means coupled to said processing circuit means for detecting the brightness of the object on the basis of an output of said processing circuit means when said converting unit receives a diffused light beam.

49. A system according to claim 48, wherein said compensating means further includes signal storing means coupled to said operating circuit means and said processing circuit means for storing an output signal of said operating circuit means when said converting unit receives the diffused light beam, and supplying said output signal to said processing circuit means.

50. A system according to claim 49, further comprising: light beam diffusion means selectively disposed between said optical system and said light-to-electrical signal converting unit for diffusing the light beam incident on said unit; said operating circuit means detecting the brightness of the object on the basis of an output of said processing circuit means when said diffusion means is disposed between said optical system and said converting unit.

51. A system according to claim 48, further comprising: a light beam diffusion means disposed between said optical system and said light-to-electrical signal converting unit and containing a liquid crystal layer, said diffusion means selectively diffusing the light beam incident on the unit; said operating circuit means detecting the brightness of the object on the basis of an output of said processing circuit means when said converting unit receives the light beam diffused by said diffusion means.

52. A system according to claim 42, further comprising: indicating means electrically connected with said detecting means for indicating the focusing condition of the optical system on the basis of an output of said detecting means.

53. A system according to claim 42, wherein at least a part of said optical system is movable along the optical axis in order to change the image sharpness on said converting unit, and said focus detecting system further comprises: driving means electrically connected with said detecting means and operatively coupled with said movable part of said optical system for moving said movable part of said optical system along the axis on the basis of an output of said detecting means.

54. A focus detecting system for detecting the focusing condition of an image forming optical system, said optical system being adjustable along an optical axis for forming an image of an object at a predetermined position, said detecting system comprising:

first and second light-to-electrical signal converting units disposed optically equidistant before and behind the predetermined position, each of said converting units comprising:

electrical insulation means permitting the passage of light therethrough and having first and second surfaces; and first and second photoelectric transducing means disposed on both surfaces of said insulation means; said first photoelectric covering means including: a first pair of electrodes in the form of strips, each strip having two long edges and two short edges shorter than the long edges, said electrodes being disposed on the first surface of the insulation means, so that the electrodes never contact each other and form a first area having a center, one of the short edges of each electrode being located near the center of said first area, and the electrodes being wound bifilarly; and a first photosensitive element disposed at least in the space of the bifilar part formed by said first electrodes;

and said second photoelectric transducing means including: a second photosensitive element in the form of a strip having two long edges and two short edges shorter than the long edges, the long edges having middle parts, said second photosensitive element being disposed on the second surface of the insulation means and folded over the second surface for forming a second area having a center so that the middle parts of the long edges are located substantially at the center of said second area, said second photosensitive element being wound bifilarly to correspond to said first photosensitive element of the first transducing means and the short edges of the second photosensitive element being located at the outside of the second area; and a second pair of electrodes being connected respectively to the short edges of said second photosensitive element;

and detecting means electrically connected with said first and second converting units for detecting the focusing condition of the image forming optical system by sensing the outputs of the first and second light-to-electrical signal converting units.

55. A system according to claim 54, in which said second photosensitive element of said second photoelectric transducing means overlies said first pair of electrodes of said first photoelectric transducing means except at the center of said first area between short edges of said first pair of the electrodes of said first photoelectric transducing means.

56. A system according to claim 55, in which said first photoelectric transducing means includes first holding means for holding said first photosensitive element while said second photoelectric transducing means includes second holding means for holding said second photosensitive element; said first and second holding means each having a surface opposing said insulation means; and said photosensitive elements in said first and second photoelectric transducing means being respectively disposed on the surfaces opposed to said insulation means.

57. A system according to claim 56, in which said second holding means permits the passage of light while said first holding means is formed so as to prevent said photosensitive elements of said first and second photoelectrid transducing means from being influenced by light from a surface opposing the surface facing saind insulation means.

58. A system according to claim 54, in which said second photosensitive element of said second photoelectric transducing means permits the passage of light and overlies said first photosensitive element of said first photoelectric transducing means.

59. A system according to claim 58, in which said first photoelectric transducing means includes first holding means for holding said first photosensitive element while said second photoelectric transducing means includes second holding means for holding said second phototransducing element; said first and second holding means each having a surface opposing and said insualtion means, said photosensitive elements in said first and second photoelectric transducing means being respectively disposed on the surfaces opposed to said insulation means.

60. A system according to claim 59, in which said second holding means permits the passage of light while said first holding means is formed so as to prevent said photosensitive elements of said first and second photoelectric transducing means from being influenced by light from a surface opposing the surface facing said insulation means.

61. A system according to claim 54, further comprises beam splitting means in said optical axis of the optical system for splitting a light beam coming from said optical system into two light beams, said first and second converting units each respectively receiving the split light beam split by said splitting means.

62. A system according to claim 54, in which said detecting means includes processing circuit means electrically connected with said first and second converting units for comparing the output of said first converting unit with the output of said second converting unit so as to produce an output signal corresponding to the focusing condition of said optical system.

63. A system according to claim 62, in which said processing circuit means includes a differential amplifier circuit for comparing the output of said first converting unit with the output of said second converting unit.

64. A system according to claim 63, in which said processing circuit means further includes first and second operational amplifier circuits each respectively connected with said first and second converting units; said differential amplifier being connected with said first and second operational amplifier circuits and producing said output signal corresponding to the focusing condition of said optical system by comparing an electrical output of said first operational amplifier circuit with an electrical output of said second operational amplifier circuit.

65. A system according to claim 62, further comprises compensating means for compensating the output signal of said processing circuit means in accordance with the brightness of said object.

66. A system according to claim 65, wherein said compensating means includes operating circuit means coupled to said processing circuit means for detecting the object brightness on the baiss of an output of said processing circuit means when said first and second converting units receive diffused light beams.

67. A system according to claim 66, wherein said compensating means further includes signal storing means electrically coupled with both said operating circuit means and said processing circuit means for storing an output signal of said operating circuit means when said first and second converting units receive the diffused light beams and supplying said output signal to said processing circuit means.

68. A system according to claim 66, further comprising: light beam diffusion means selectively disposed between said image forming optical system and said light-to-electrical signal converting units so as to diffuse the light beam incident on said units; said operating circuit means detecting the object brightness on the basis of the output of said processing circuit means when said diffusion means is disposed between said optical system and said converting units.

69. A system according to claim 66, further comprising: light beam diffusion means disposed between said image forming optical system and said light-to-electrical signal converting units and containing a liquid crystal layer, said light beam diffusion means selectively diffusing the light beam incident on said units; said operating circuit means detecting the object brightness on the basis of an output of said processing circuit means when said converting units receive the diffused light beam diffused by said diffusion means.

70. A system according to claim 58, in which said first photosensitive element and said first pair of electrodes of said first photoelectric transducing means permit the passage of light, and said first and second converting units are disposed on the same optical axis of said optical system.

71. A system according to claim 70, in which said first photoelectric transducing means includes a first transparent base plate for holding said first photosensitive element while said second photoelectric transducing means includes a second transparent base plate for holding said second photosensitive element; said first and second base plates each having a surface opposing said insulation means; and said photosensitive elements in said first and second photoelectric transducing means being respectively disposed on the surfaces opposed to said insulation means.

72. A system according to claim 55, wherein each of said first and second photoelectric transducing means of said converting units have electrical output characteristics such that the outputs of said first and second transducing means reach extreme values when the image sharpness reaches maximum.

73. A system according to claim 72, wherein said first and second photoelectric transducing means of said converting units have mutually different electrical output characteristics with respect to the change in the image sharpness.

* * * * *